(12) United States Patent
Cummings et al.

(10) Patent No.: US 7,161,828 B2
(45) Date of Patent: *Jan. 9, 2007

(54) ASYNCHRONOUS STATIC RANDOM ACCESS MEMORY

(75) Inventors: Uri Cummings, Santa Monica, CA (US); Andrew Lines, Calabasas, CA (US)

(73) Assignee: Fulcrum Microsystems, Inc., Calabasas, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 11/200,722

(22) Filed: Aug. 9, 2005

(65) Prior Publication Data

US 2005/0276095 A1   Dec. 15, 2005

Related U.S. Application Data

(63) Continuation of application No. 10/890,816, filed on Jul. 13, 2004.

(60) Provisional application No. 60/487,536, filed on Jul. 14, 2003.

(51) Int. Cl.
*G11C 11/00*   (2006.01)

(52) U.S. Cl. .................. 365/154; 365/194; 365/203; 365/230.03; 365/230.05

(58) Field of Classification Search ........... 365/154, 365/194, 203, 230.03, 230.05
See application file for complete search history.

(56) References Cited

U.S. PATENT DOCUMENTS

| | | | |
|---|---|---|---|
| 5,752,070 A | 5/1998 | Martin et al. | |
| 5,790,461 A | 8/1998 | Holst | |
| 6,038,656 A | 3/2000 | Martin et al. | |
| 6,349,378 B1 | 2/2002 | Duranton et al. | |
| 6,446,249 B1 | 9/2002 | Wang et al. | |
| 6,502,180 B1 * | 12/2002 | Martin et al. ............. | 712/25 |
| 6,505,323 B1 | 1/2003 | Lipton et al. | |
| 6,519,204 B1 | 2/2003 | Slamowitz et al. | |
| 6,614,438 B1 | 9/2003 | Bru | |
| 6,732,336 B1 | 5/2004 | Nystrom et al. | |
| 2003/0146073 A1 | 8/2003 | Cummings et al. | |
| 2003/0151426 A1 | 8/2003 | Islam | |
| 2003/0159078 A1 | 8/2003 | Davies et al. | |

OTHER PUBLICATIONS

Andrew Matthew Lines, *Pipelined Asynchronous Circuits*, Jun. 1995, revised Jun. 1998, pp. 1-37.
Alain J. Martin, *Compiling Communicating Processes into Delay-Insensitive VLSI Circuits*, Dec. 31, 1985, Department of Computer Science California Institute of Technology, Pasadena, California, pp. 1-16.
Alain J. Martin, *Erratum: Synthesis of Asynchronous VLSI Circuits*, Mar. 22, 2000, Department of Computer Science California Institute of Technology, Pasadena, California, pp. 1-143.
U.V. Cummings, et al. *An Asynchronous Pipelined Lattice Structure Filter*, Department of Computer Science California Institute of Technology, Pasadena, California, pp. 1-8. Nov. 1994.
Alain J. Martin, et al. *The Design of an Asynchronous MIPS R3000 Microprocessor*, Department of Computer Science California Institute of Technology, Pasadena, California, pp. 1-18. Sep. 1997.

* cited by examiner

*Primary Examiner*—Hoai V. Ho
(74) *Attorney, Agent, or Firm*—Beyer Weaver & Thomas, LLP

(57) ABSTRACT

A static random access memory (SRAM) is provided including a plurality of SRAM state elements and SRAM environment circuitry. The SRAM environment circuitry is operable to interface with external asynchronous circuitry and to enable reading of and writing to the SRAM state elements in a delay-insensitive manner.

34 Claims, 19 Drawing Sheets

FIG. 3 (Env_1)

FIG. 4 (Env 4_1)

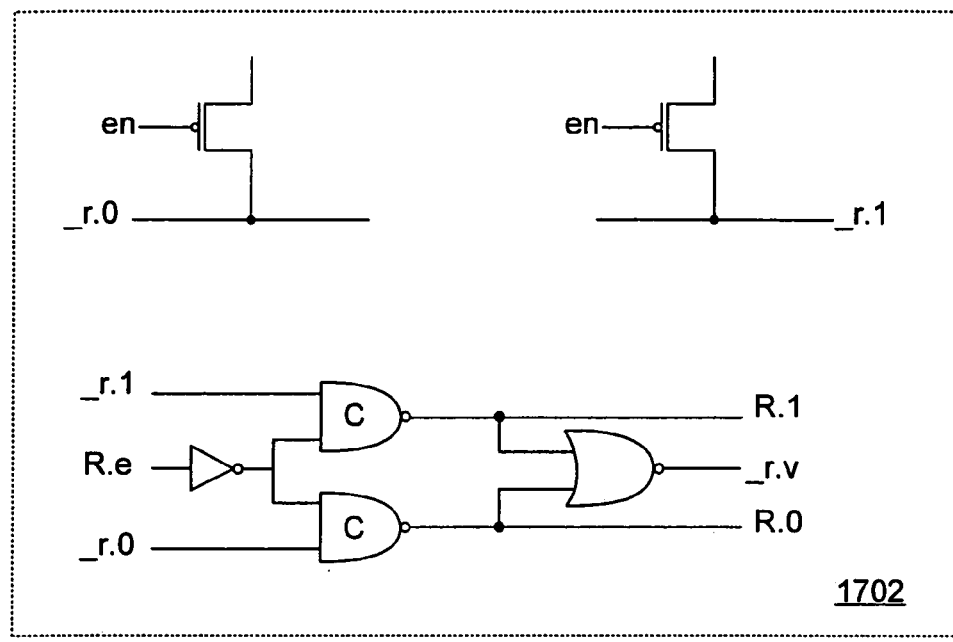
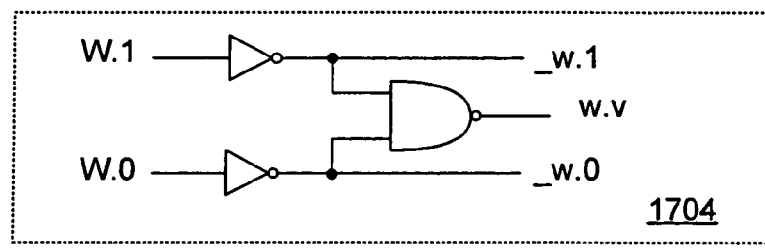
FIG. 17

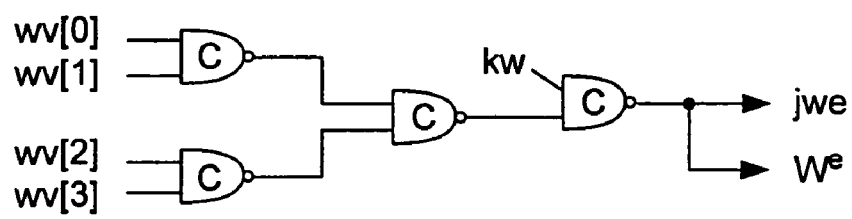
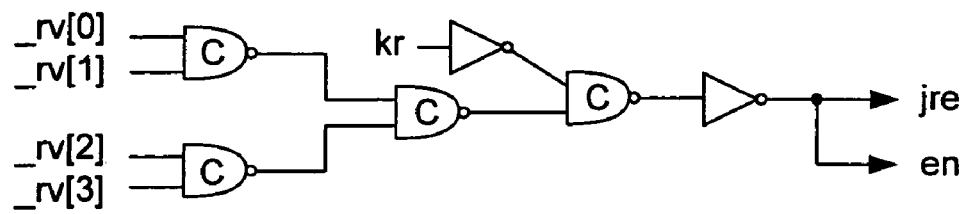
FIG. 19

DEMUX 1810

CTRL 1814

ASYNCHRONOUS STATIC RANDOM ACCESS MEMORY

RELATED APPLICATION DATA

The present application is a continuation of and claims priority under 35 U.S.C. 120 to U.S. patent application Ser. No. 10/890,816 filed on Jul. 13, 2004, which claims priority under 35 U.S.C. 119(e) to U.S. Provisional Patent Application No. 60/487,536 filed on Jul. 14, 2003, the entire disclosures of both of which are incorporated herein by reference for all purposes.

BACKGROUND OF THE INVENTION

The present invention relates to asynchronous digital circuit design and in particular to an asynchronous static random access memory.

The ever increasing demand for simultaneously faster and more complex digital circuits, e.g., microprocessors, has pushed conventional digital circuit design methodologies to their limits. Because of the combination of high clock rates (i.e., greater than 100 MHz) and design complexity (e.g., very large scale integration (VLSI) devices with 10 million or more transistors), signal propagation delay has become a dominant design consideration. It has become clear that a significant design paradigm shift will be necessary if digital circuit design is to continue its historical adherence to Moore's law.

Asynchronous VLSI is an active area of research and development in digital circuit design. It refers to all forms of digital circuit design in which there is no global clock synchronization signal. Delay-insensitive asynchronous designs, by their very nature are insensitive to the signal propagation delays which have become the single greatest obstacle to the advancement of traditional design paradigms. That is, delay-insensitive circuit design maintains the property that any transition in the digital circuit could have an unbounded delay and the circuit will still behave correctly. The circuits enforce sequencing but not absolute timing. This design style avoids design and verification difficulties that arise from timing assumptions, glitches, or race conditions.

Generally speaking, synchronous design styles are facing serious performance limitations. Certain asynchronous design methodologies also have difficulties with some of the same types of limitations, e.g., race conditions. By contrast, the delay-insensitive branch of asynchronous digital design, because of its relative immunity to these limitations, appears to hold great promise for supporting future advancements in the performance of digital circuits.

For background information regarding delay-insensitive asynchronous digital design, please refer to the following papers: A. J. Martin, "Compiling Communicating Processes into Delay-Insensitive Circuits," *Distributed Computing*, Vol. 1, No. 4, pp. 226–234, 1986; U. V. Cummings, A. M. Lines, A. J. Martin, "An Asynchronous Pipelined Lattice Structure Filter." *Advanced Research in Asynchronous Circuits and Systems*, IEEE Computer Society Press, 1994; A. J. Martin, A. M. Lines, et al, "The Design of an Asynchronous MIPS R3000 Microprocessor." *Proceedings of the 17th Conference on Advanced Research* in VLSI, IEEE Computer Society Press, 1997; and A. M. Lines, "Pipelined Asynchronous Circuits." *Caltech Computer Science Technical Report* CS-TR-95-21, Caltech, 1995; the entire disclosure of each of which is incorporated herein by reference for all purposes.

See also U.S. Pat. No. 5,752,070 for "*Asynchronous Processsors*" issued May 12, 1998, and U.S. Pat. No. 6,038,656 for "*Pipelined Completion for Asynchronous Communication*" issued on Mar. 14, 2000, the entire disclosure of each of which is incorporated herein by reference for all purposes.

If asynchronous digital design techniques are to be the digital design methodology which enables the performance of digital circuits and systems to continue to improve in accordance with historical norms, the basic building blocks of such circuits and systems must be provided which rival and exceed the performance of their synchronous counterparts. An example of such a basic building block is the static random access memory (SRAM).

The conventional synchronous circuitry from which such SRAMs are typically constructed is well known. However, as the size of SRAM state elements has decreased, conventional SRAM designs have become more challenging with respect to the increased sensitivity to variations in delay. On the other hand, the insensitivity to delay characterizing some asynchronous design styles presents an opportunity to address such issues.

It is therefore desirable to provide an asynchronous environment in which conventional SRAM state elements may be successfully employed.

SUMMARY OF THE INVENTION

According to the present invention, various asynchronous circuit topologies are provided for use with conventional and other types of SRAM state elements to enable an SRAM which is quite robust with respect to variations in delay.

According to various embodiments, a static random access memory (SRAM) is provided including a plurality of SRAM state elements and SRAM environment circuitry. The SRAM environment circuitry is operable to interface with external asynchronous circuitry and to enable reading of and writing to the SRAM state elements in a delay-insensitive manner provided that at least one timing assumption relating to bit lines included in the SRAM environment circuitry is met.

According to a particular embodiment, the at least one timing assumption comprises at least one of assuming sufficient pre-charging of the bit lines in response to an enable signal representing completion of a previous memory access operation, and assuming latching of the SRAM state elements in response to write signals on the bit lines. According to another particular embodiment, the at least one timing assumption comprises a single timing assumption which assumes latching of the SRAM state elements in response to write signals on the bit lines. According to various of the embodiments, the SRAM state elements comprise either of conventional six-transistor (6T) SRAM state elements, or conventional ten-transistor (10T) SRAM state elements.

According to various embodiments, the SRAM environment circuitry comprises read circuitry, write circuitry and address generation circuitry. According to one embodiment, the address generation circuitry is operable to generate delay-insensitive addresses from an asynchronous address channel. According to another embodiment, the read circuitry is operable to facilitate transmission of a data token from the SRAM state elements to the external asynchronous circuitry via a read channel in response to a read instruction and an enable signal representing completion of a previous operation. According to yet another embodiment, the write circuitry is operable to facilitate transmission of a data token from the external asynchronous circuitry to the SRAM state elements via a write channel in response to a write instruction and an enable signal representing completion of a previous operation. According to a further embodiment, the SRAM environment circuitry is operable to enable reading of and writing to the SRAM state elements in the delay-insensitive manner provided that an additional timing assumption is met, the additional timing assumption being that the address generation circuitry has decoded an address value.

According to various embodiments, the SRAM state elements and the SRAM environment circuitry are organized into a plurality of SRAM banks and the external asynchronous circuitry includes a write channel and a read channel. The SRAM further includes split circuitry for enabling transmission of write data tokens from the write channel to any of the SRAM banks, and merge circuitry for enabling transmission of read data tokens from any of the SRAM banks to the read channel. According to one embodiment, the external asynchronous circuitry includes a plurality of write channels, and the split circuitry is a crossbar circuit which is operable to route the write data tokens from any of the plurality of write channels to any of the SRAM banks according to routing control information. According to another embodiment, the external asynchronous circuitry includes a plurality of read channels, and the merge circuitry is a crossbar circuit which is operable to route the read data tokens from any of the SRAM banks to any of the plurality of read channels according to routing control information.

According to some embodiments, the external asynchronous circuitry is characterized by an event-driven protocol. According to a specific embodiment, the event-driven protocol between a first sender and a first receiver is as follows: (1) the first sender sets a data signal valid when an enable signal from the first receiver goes high, (2) the first receiver lowers the enable signal upon receiving the valid data signal, (3) the first sender sets the data signal neutral upon receiving the low enable signal, and (4) the first receiver raises the enable signal upon receiving the neutral data signal.

A further understanding of the nature and advantages of the present invention may be realized by reference to the remaining portions of the specification and the drawings.

BRIEF DESCRIPTION OF THE DRAWINGS

FIGS. 17–21 include transistor and higher level diagrams for an SRAM employing a 10T state element according to a specific embodiment of the invention.

DETAILED DESCRIPTION OF SPECIFIC EMBODIMENTS

Figure 1:
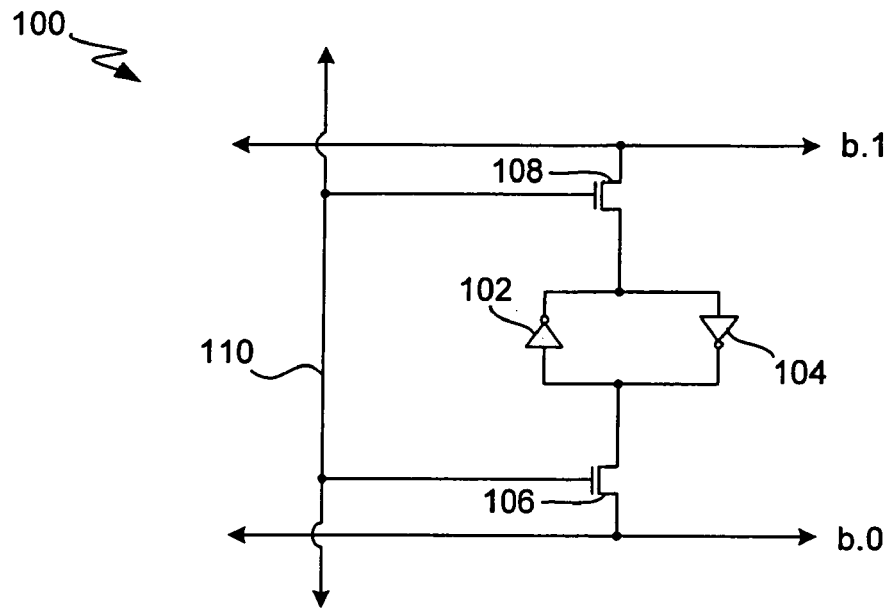
FIG. 1 is a schematic diagram of a single-ported 6T SRAM state element for use with various embodiments of the present invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known processes have not been described in detail in order not to unnecessarily obscure the present invention.

It should also be noted that specific embodiments of the invention are described in the context of a design style relating to quasi-delay-insensitive asynchronous VLSI circuits. However it will be understood that many of the principles and techniques of the invention may be used in other contexts such as, for example, non-delay insensitive asynchronous VLSI as well as synchronous VLSI.

According to various specific embodiments, the asynchronous design style employed in conjunction with the invention is characterized by the latching of data in channels instead of registers. Such channels implement a FIFO (first-in-first-out) transfer of data from a sending circuit to a receiving circuit. Data wires run from the sender to the receiver, and an enable (i.e., an inverted sense of an acknowledge) wire goes backward for flow control. According to specific ones of these embodiments, a four-phase handshake between neighboring circuits (processes) implements a channel. The four phases are in order: 1) Sender waits for high enable, then sets data valid; 2) Receiver waits for valid data, then lowers enable; 3) Sender waits for low enable, then sets data neutral; and 4) Receiver waits for neutral data, then raises enable. It should be noted that the use of this handshake protocol is for illustrative purposes and that therefore the scope of the invention should not be so limited.

According to other aspects of this design style, data are encoded using 1ofN encoding or so-called "one hot encoding." This is a well known convention of selecting one of N+1 states with N wires. The channel is in its neutral state when all the wires are inactive. When the kth wire is active and all others are inactive, the channel is in its kth state. It is an error condition for more than one wire to be active at any given time. For example, in certain embodiments, the encoding of data is dual rail, also called 1of2. In this encoding, 2 wires (rails) are used to represent 2 valid states and a neutral state. According to other embodiments, larger integers are encoded by more wires, as in a 1of3 or 1of4 code. For much larger numbers, multiple 1ofN's may be used together with different numerical significance. For example, 32 bits can be represented by 32 1of2 codes or 16 1of4 codes.

In some cases, the above-mentioned asynchronous design style may employ the pseudo-code language CSP (concurrent sequential processes) to describe high-level algorithms and circuit behavior. CSP is typically used in parallel programming software projects and in delay-insensitive VLSI. Applied to hardware processes, CSP is sometimes known as CHP (for Communicating Hardware Processes). For a description of this language, please refer to "Synthesis of Asynchronous VLSI Circuits," by A. J. Martin, DARPA Order number 6202. 1991, the entirety of which is incorporated herein by reference for all purposes.

The transformation of CSP specifications to transistor level implementations for use with various techniques described herein may be achieved according to the techniques described in "Pipelined Asynchronous Circuits" by A. M. Lines, *Caltech Computer Science Technical Report* CS-TR-95-21, Caltech, 1995, the entire disclosure of which is incorporated herein by reference for all purposes. However, it should be understood that any of a wide variety of asynchronous design techniques may also be used for this purpose.

According to various embodiments of the present invention, an SRAM is provided which is operable in an asynchronous environment, and which is robust to delay and transistor variations. More specifically, read and write circuitry and control circuitry is provided which enables the use of conventional SRAM state elements in, for example, asynchronous systems implemented according to the design style described above.

FIG. 1 illustrates a conventional six-transistor (6T) SRAM state element 100 for use with various embodiments of the invention. SRAM state element 100 includes a pair of cross-coupled inverters 102 and 104 with transistor pass gates 106 and 108 connected to corresponding bit lines b.0 and b.1. An address line 110 is operable to turn on pass gates 106 and 108 thereby exposing the bit lines to the states on the internal nodes x.0 and x.1 of the SRAM state element.

Bit lines b.0 and b.1 can be thought of as a dual-rail representation of the data stored in SRAM state element 100. As will be shown, this characteristic of the conventional SRAM state element makes it amenable for interacting with asynchronous channels designed according to a variety asynchronous design styles. According to a specific embodiment, the interaction between a conventional SRAM state element and the asynchronous handshake protocol associated with a specific design style is particularly efficient.

To read the state of SRAM state element 100, address line 110 is used to turn on transistor pass gates 106 and 108 to connect bits lines b.0 and b.1 (which are pre-charged high) to internal nodes x.0 and x.1, respectively. The internal node which is low pulls the corresponding bit line low which is sensed, with the dual rail value then being buffered and sent to the requester. To write to SRAM state element 100, address line 110 is again used to expose the internal nodes to the bit lines which are then driven with the desired write values, overpowering the transistors in the cross-coupled inverters 102 and 104 to establish the new internal state of the state element. This behavior is common to all implementations, synchronous or asynchronous, that use the 6T SRAM state element.

Figure 2:
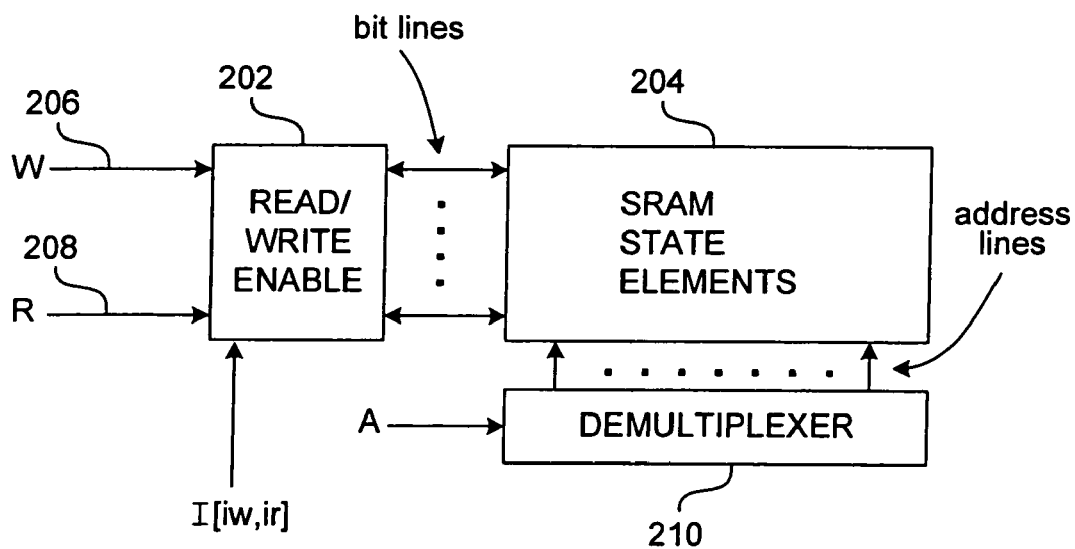
FIG. 2 is a block diagram of an asynchronous SRAM designed according to a specific embodiment of the invention.

FIG. 2 is a high level block diagram in which the SRAM transistor and circuit topologies of the present invention may be employed. Read/write circuitry 202 associated with an array 204 of SRAM state elements has a write channel 206 going in and a read channel 208 coming out, and is coupled to array 204 via a plurality of bi-directional bit lines. According to a specific embodiment, each of the read and write channels is dual rail by N bits, and the bit lines are also dual rail (i.e., b.0 and b.1) by N bits. However, it will be understood that these are merely exemplary. A demultiplexer 210 receives an instruction I comprising write and read control signals "iw" and "ir" and selects the appropriate address line(s) associated with SRAM array 204. The nature of read/write circuitry 202 will now be described with reference to FIGS. 3–5.

According to a specific embodiment, circuitry 202 is organized into three levels of hierarchy. The following description will begin on the first and lowest level of hierarchy as represented by read and write circuitry 300 (FIG. 3) comprising write circuits 302 and 304 which are configured to drive one of a pair of bit lines (b.0 and b.1) low during a write operation. Enable signal "en" pre-charges the bit lines b.0 and b.1, signals when the system is ready to write, and is reset every cycle. Signal w.0 is high when a logic "0" is to be written to the selected SRAM cell(s), and signal w.1 is high when a logic "1" is to be written to the selected SRAM cell(s). Referring to circuit 302, for example, the coincidence of highs on en, iw, and w.0 causes precharged bit line b.1 to be pulled down while bit line b.0 remains high. This results in a logic "0" being written into any cells on that bus with their address lines selected. Write completion is indicated by NOR'ing signals w.0 and w.1 together resulting in write completion signal _W.v. It is also possible to check that the bit lines have been driven by the write circuitry, thus removing one timing assumption at the expense of extra transistors.

Read circuitry 306 comprises read circuits 308 and 310. When read control signal "ir" goes high (and therefore _ir goes low), the corresponding transistors in circuits 308 and 310 are turned on. At the same time, an address line has been selected which exposes bit lines b.0 and b.1 to the internal states x.0 and x.1 of a corresponding state element. This results in one of b.0 and b.1 going low (depending on the state of the state element) which, in turn, is sensed on the corresponding one of signal lines r.1 and r.0, e.g., if b.0 goes low, r.1 goes high. It should be noted that the enable signal "en" and the read control signals "ir" are mutually exclusive, thereby preventing a read operation to be enabled while the bit lines are pre-charging. It should be noted that, according to some alternative embodiments, circuits 308 and 310 could be replaced with sense amps.

Figure 3:
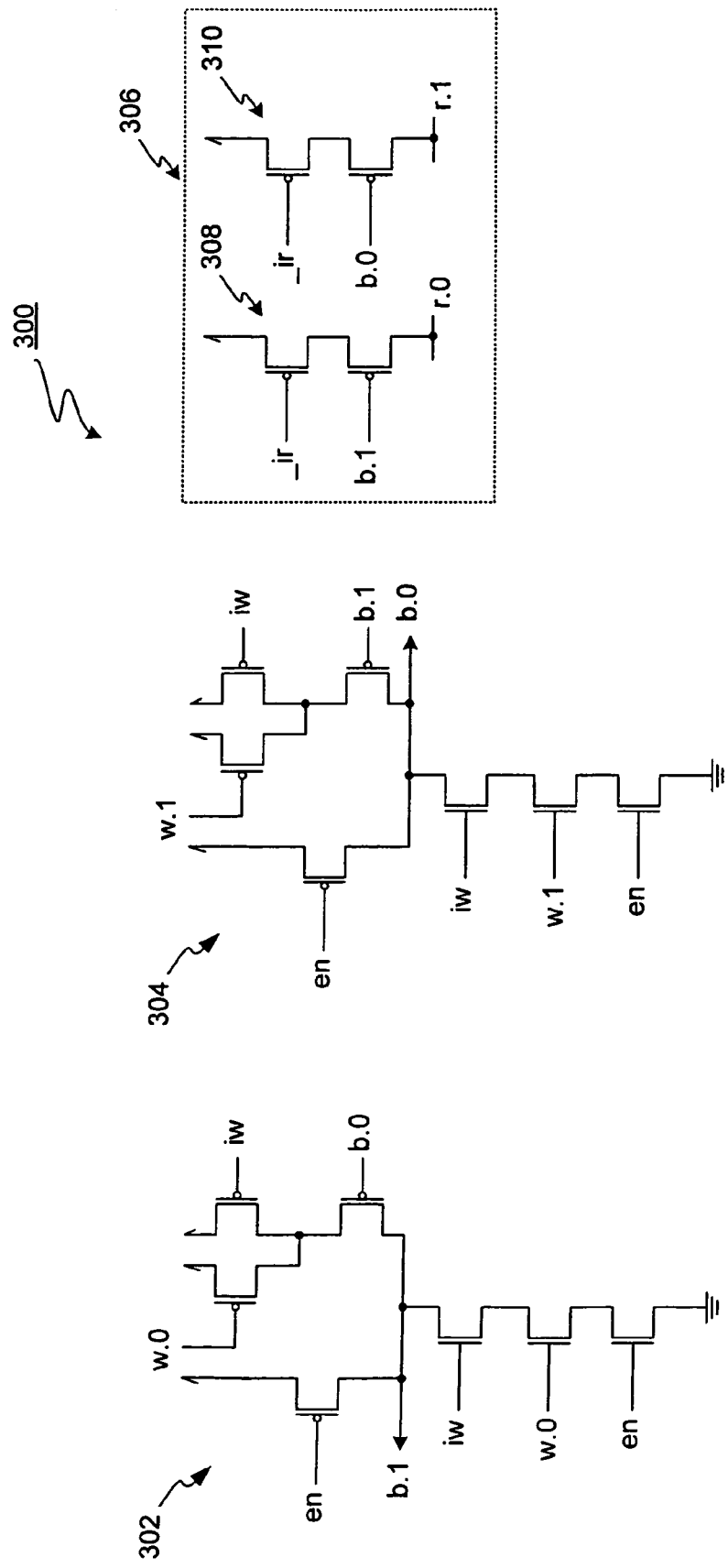
FIGS. 3–5 include transistor and higher level diagrams for read and write circuitry for an SRAM employing a 6T state element according to a specific embodiment of the invention.
Figure 4:
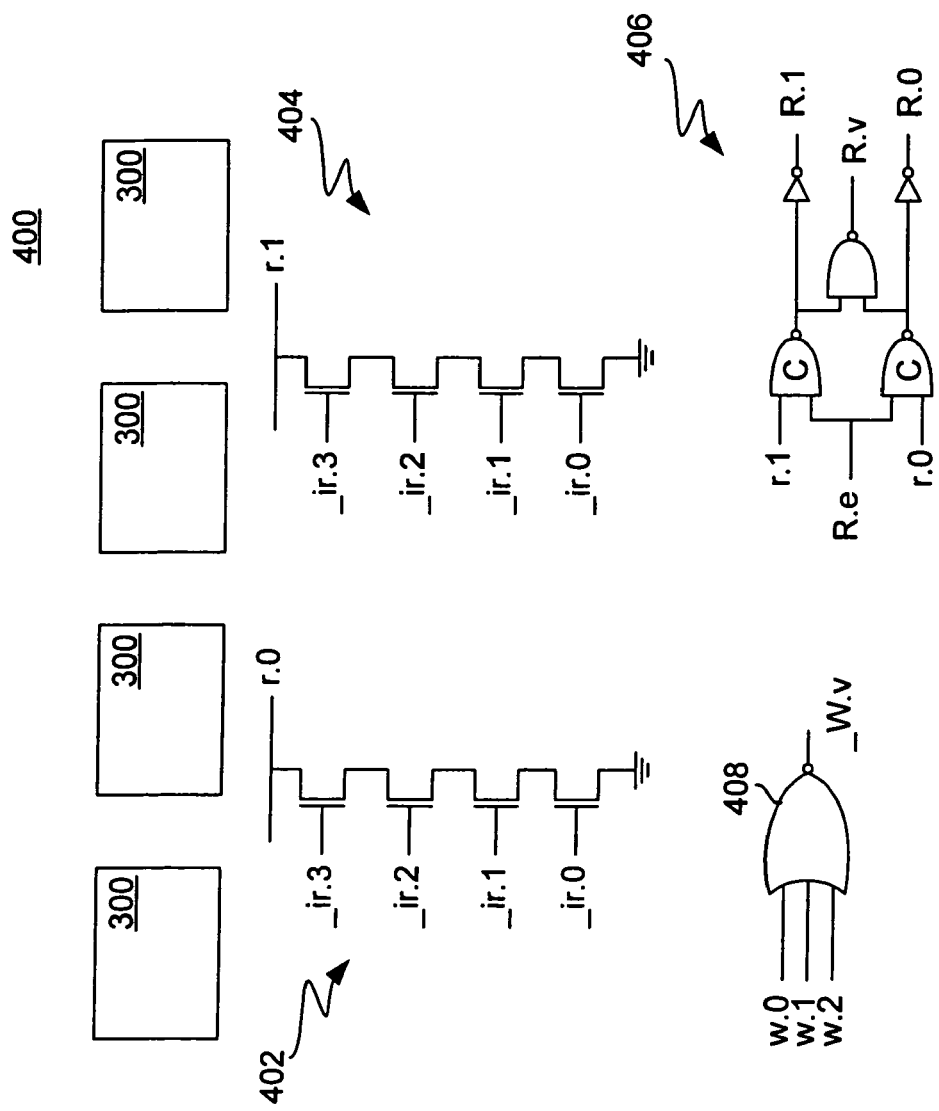

FIG. 4 shows the second or next level of the hierarchy 400 of read/write circuitry 202 in which read and write circuitry 300 of FIG. 3 is reproduced four times, once for each of four SRAM state elements each of which corresponds to a set of state elements in the SRAM array. The state elements in the arrays are divided into sets to reduce the capacitive loading on the state element circuitry. According to various embodiments and depending upon the size of the SRAM array, the number of sets may vary. The embodiment shown is the four sets by one bit version of the circuit.

The four _ir signals for the four instances of circuitry 306 are mutually exclusive low, i.e., only one can be low at any given time. Thus, circuits 402 and 404 reset read lines r.0 and r.1 when all of the inverted read selects go high. A half buffer circuit 406 may be optionally employed to boost read signals r.0 and r.1 to read signals R.0 and R.1, respectively, which buffers the load on r.0 and r.1, and provides a read completion circuit efficiently, i.e., read completion signal R.v. Thus, with the appropriate circuitry and flow control, a read operation on a conventional SRAM state element (with the dual-rail-like character of its bit lines) is able to produce an output which is in the proper event-driven dual-rail channel format of the quasi-delay-insensitive asynchronous system. Write completion signal _W.v is generated by logically combining signals w.0 and w.1 with NOR gate 408. According to the specific embodiment shown, the generation of _W.v may optionally include a third signal w.2 which indicates not to write that bit and can implement individual bit enables which can be used to mask specific bits. Thus, the selective writing of individual bits (or groups of bits, e.g., nibbles and bytes) may be achieved at very low cost.

According to a specific embodiment, the robustness of these circuits in the face of delay variations is predicated on some simple timing assumptions which relate to the driving of the bit lines. That is, when the enable signal "en" is driven low causing the bit lines to precharge, there is no acknowledgement, the assumption being that the bit lines will be precharged in a sufficiently short period of time to ensure otherwise delay-insensitive operation. Similarly, when the bit lines are driven low or high for write operations, there is no acknowledgement, the assumption being that the bit lines and state bits will stabilize in a sufficiently short period of time. These assumptions have considerable margin and eliminate the need for more complicated completion circuitry. For example, these assumptions allow the write completion to be a simple combination of the signals w.0 and w.1. According to some embodiments, the demultiplexing of the address channel may also be unacknowledged, an additional timing assumption being made that the demultiplexing operation will occur within a sufficient period of time to allow otherwise delay-insensitive operation.

Figure 5:
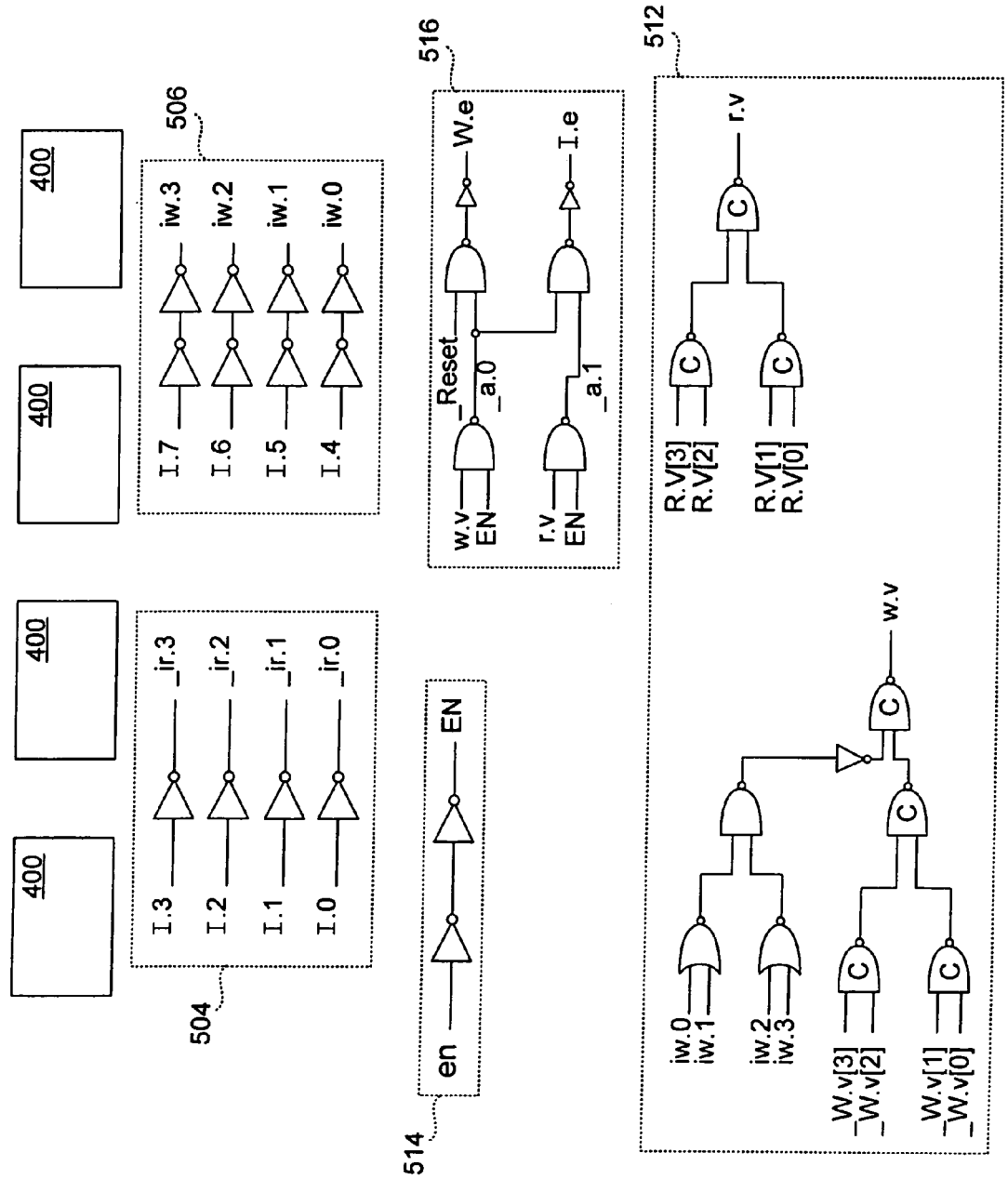

FIG. 5 shows the third or next higher level of the hierarchy of read/write circuitry 202 in which the circuitry of FIG. 4 is reproduced four times (represented by blocks 400) to create a four sets by four bits block. And as described above, each of blocks 400 includes four of blocks 300 which are, in turn, each reproduced for each of N bits (e.g., 32 or 64 bits) in a row.

The instruction "I" received by the demultiplexer (e.g., demultiplexer 210 of FIG. 2) identifies which sets are to be selected. According to a specific embodiment, a 1of8 code (I.0 through I.7) is used to identify the type of operation (i.e., read or write) and which of the four sets is selected. Referring again to FIG. 5, the read selects (I.0 through 1.3) are inverted (block 504) to get the mutually exclusive low set of signals _ir.0 through _ir.3 discussed above. The write selects (I.4 through I.7) are buffered (block 506) to get signals iw.0 through iw.3. This buffering approach is suitable for cases where there is sufficient time to accomplish this. Alternatively, in cases where it is desirable to save time, blocks 504 and 506 may comprise pipelined circuits which are able to latch and acknowledge their respective values more quickly than the simple buffering approach.

The buffered write selects, write completion signals _W.v [0] through _W.v[3], and read completion signals R.v[0] through R.v[3] are completed (block 512) to generate w.v and r.v. The enable signal may be "ramped up" using an inverter chain having an even number of inverters (e.g., block 514) to generate signal EN. The signal EN is then combined with each of w.v and r.v using C-elements, the outputs of which are NAND'ed to generate an instruction acknowledge I.e which acknowledges to the instruction channel that the operation has been completed and that another instruction may be issued (block 516). In addition, for each write operation, write acknowledge signal W.e is generated to acknowledge the write channel (e.g., circuitry 202 of FIG. 2) and to indicate that the write channel is ready for the next token.

A more detailed description of a single-ported SRAM having an exemplary physical topology and implemented using the circuits of FIGS. 3–5 will now be described with reference to FIG. 6. It will be understood that the topology shown in merely exemplary, and that a wide variety of topologies may be employed without departing from the scope of the invention.

SRAM 600 comprises two substantially identical blocks 602 and 604 on either side of demultiplexer 606 and control circuit 608. For a 48-bit wide memory system, each of blocks 602 and 604 includes 6 substantially identical rows of the SRAM state elements and the read/write circuitry shown in FIGS. 1–5. Different numbers of rows will correspond to different widths, e.g., for a 32-bit wide memory system, each of blocks 602 and 604 would have 4 rows. Each such row (an example of which is shown in the bottom of block 604) includes one instance of the circuitry of FIG. 5 (4×4 block 610), followed by 4 instances of the circuitry of FIG. 4 (4×1 block 612), i.e., one for each set, followed by 64 columns 614 of SRAM state elements, each column comprising 16 such state elements, i.e., 4 information bits and 4 sets. The bit lines (not shown) associated with the 64×16 array of state elements have staticizers which hold the values of the bit lines. Thus, SRAM block 600 is a 1.5 kB block which is repeatable to generate a larger SRAM memory system.

Figure 7:
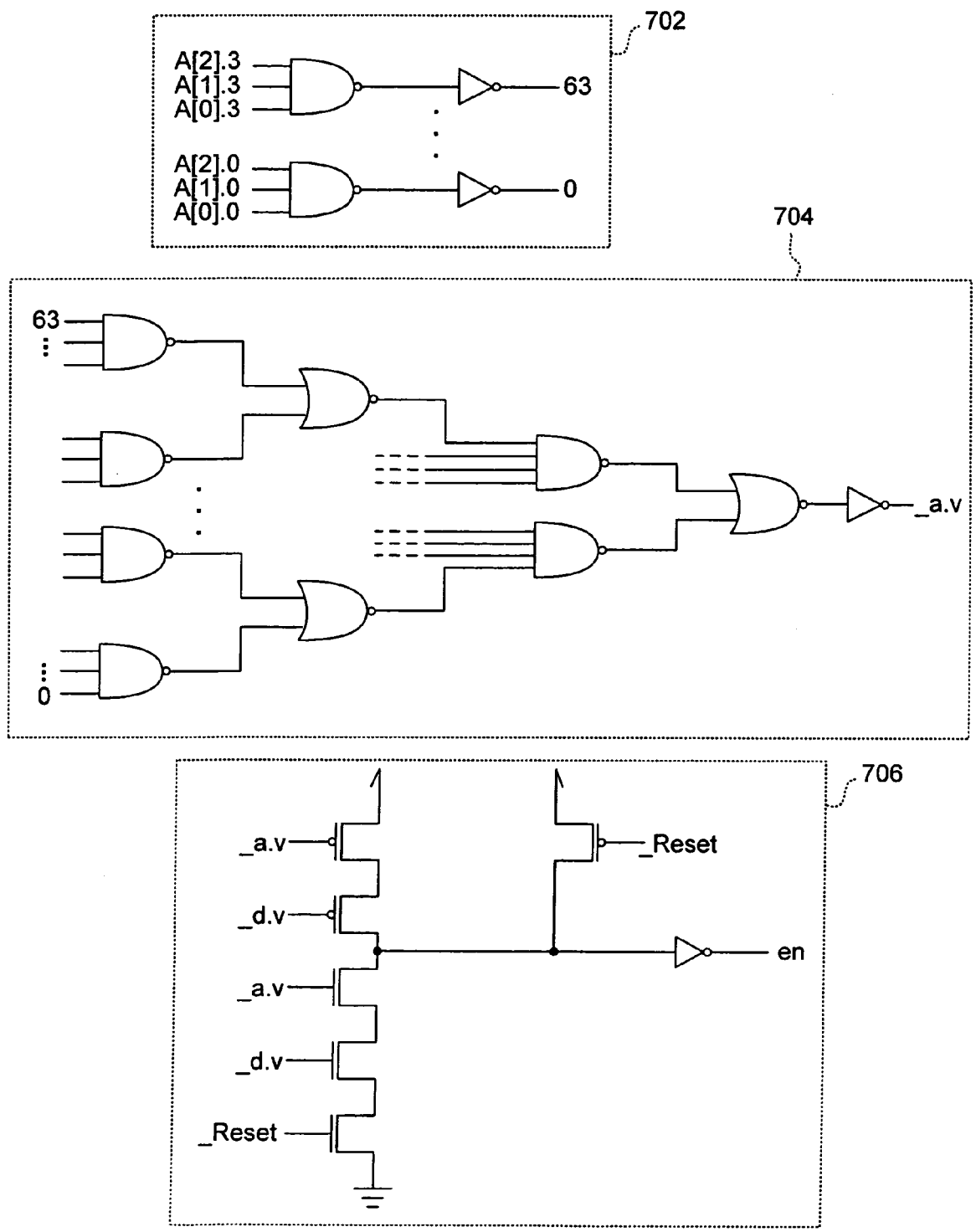
FIG. 7 includes various transistor and higher level diagrams of portions of the SRAM design of FIG. 6.

Details of how demultiplexer 606 may be implemented to generate address information according to a specific embodiment will now be described with reference to FIG. 7. According to this embodiment, the address information comes in a 3 by 1of4 code which is converted to the conventional 1ofN code for SRAMs (in this case 1of64) using 64 3-input AND gates, i.e., NAND gates with an inverter, (block 702). According to a specific embodiment, the address generation circuitry may be made delay-insensitive using completion circuitry to complete the 1ofN code. Such completion circuitry may comprise, for example, completion tree 704 (or any equivalent) which generates address completion signal a.v.

For read operations, a.v represents completion of the neutrality of the address generation because the read lines themselves complete the validity of the address, i.e., the read couldn't have occurred without the address. For write operations, a.v represents the validity and neutrality of the address. It should be noted that the demultiplexer implementation described above is merely exemplary and should not be used to limit the invention. That is, as long as the 1ofN code is set and reset appropriately, the demultiplexer may be implemented in a wide variety of ways.

Figure 6:
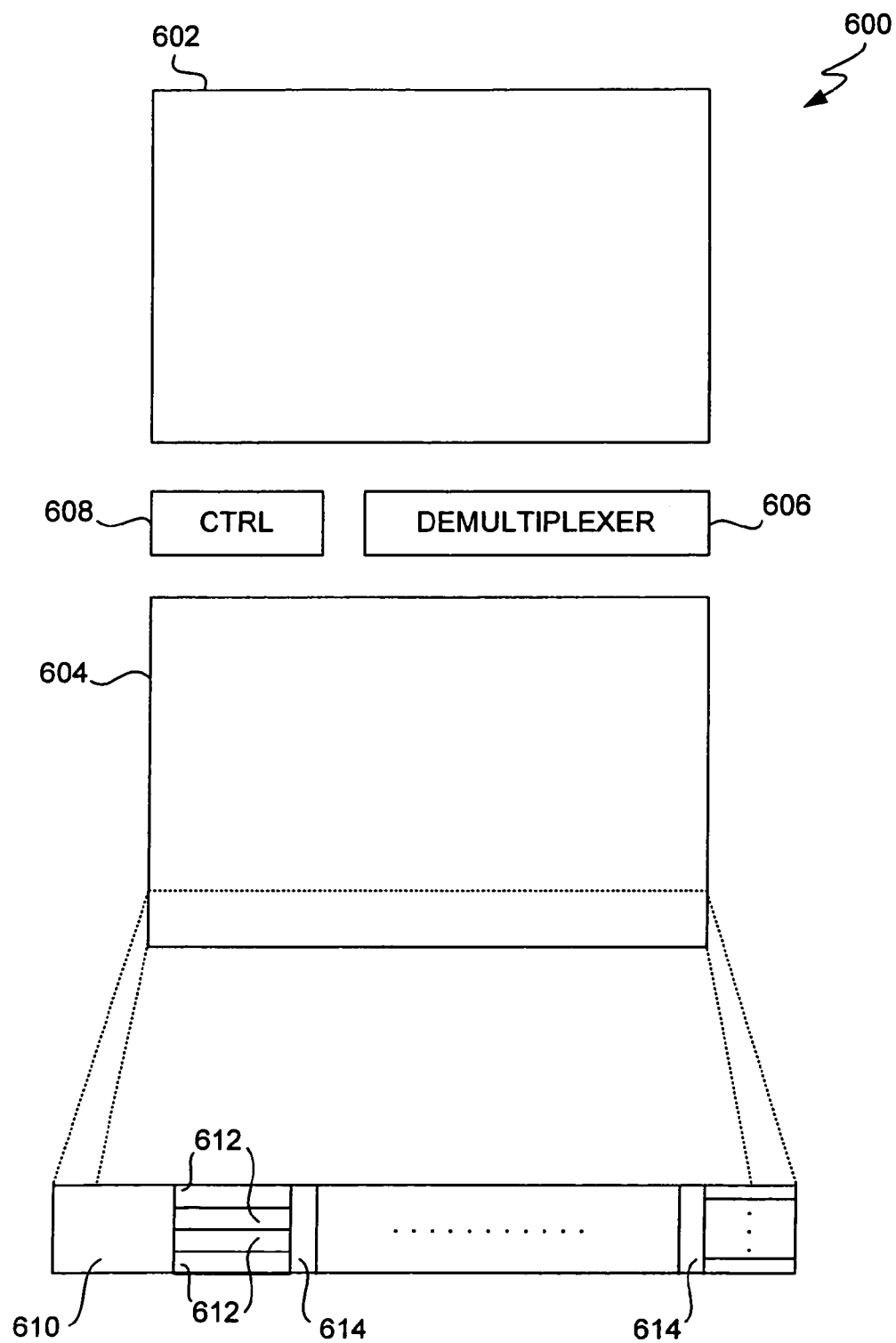
FIG. 6 is a block diagram of an asynchronous SRAM designed according to a specific embodiment of the invention.

In addition, the instruction acknowledge signals I.e for all of the instances of 4×4 block 610 of FIG. 6 are completed using, for example, eight-input C-element trees or equivalent structures generating a completion signal d.v. Inverted versions of the address completion signal a.v, completion signal d.v, and the reset signal (a global signal which resets the whole circuit) are used as input to a circuit 706 which generates the enable signal en which is then broadcast throughout the memory block for all its various uses including as acknowledge for entire control channel, and for all of the 1of4 address codes.

According to various embodiments of the invention, a repair functionality may be introduced into the SRAM blocks. According to one such embodiment, a $65^{th}$ address line and corresponding state elements are included in the design described above. If, during testing of the fabricated chip, a bit error is identified for one of the first 64 addresses, the address decoding circuitry may be enabled to perform an address translation so that the 65$^{th}$ address may be substituted for the detected bad address. This may involve, for example, a stage inserted before the demultiplexer which converts from 64 to 65 addresses. As will be understood, such a capability may also involve alterations to the various completion circuitry to account for this extra circuitry when it is use.

According to various other embodiments of the invention, the SRAM design described above may be employed with additional circuitry to implement a banked asynchronous SRAM design. In one such embodiment shown in FIG. 8, a plurality of SRAM banks 802 designed as described above employ a Split 804 to select a bank for a write operation via write channel W, and a Merge 806 to select a bank for a read operation via read channel R. These selections are accomplished in response to a control channel IA which includes one read/write bit and n bits of address information.

Figure 9:
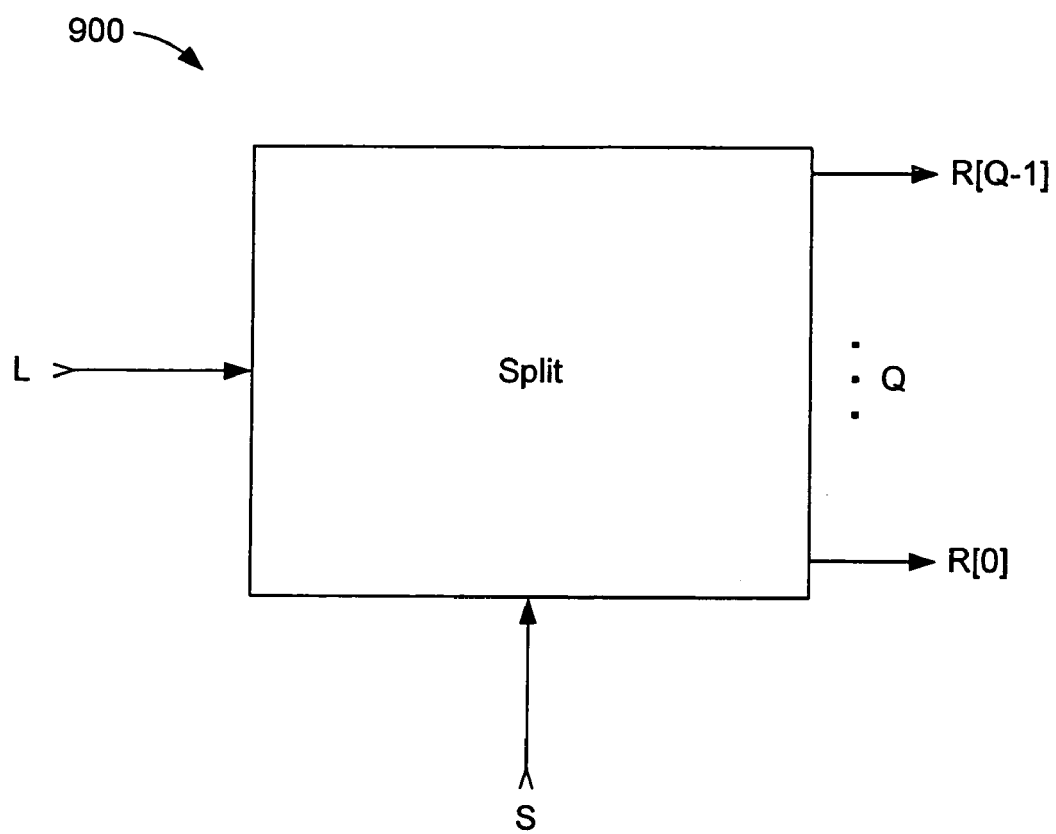
FIGS. 9–14 include transistor and higher level diagrams of Split and Merge circuits for use with various banked SRAMs designed according to the present invention.
Figure 10:
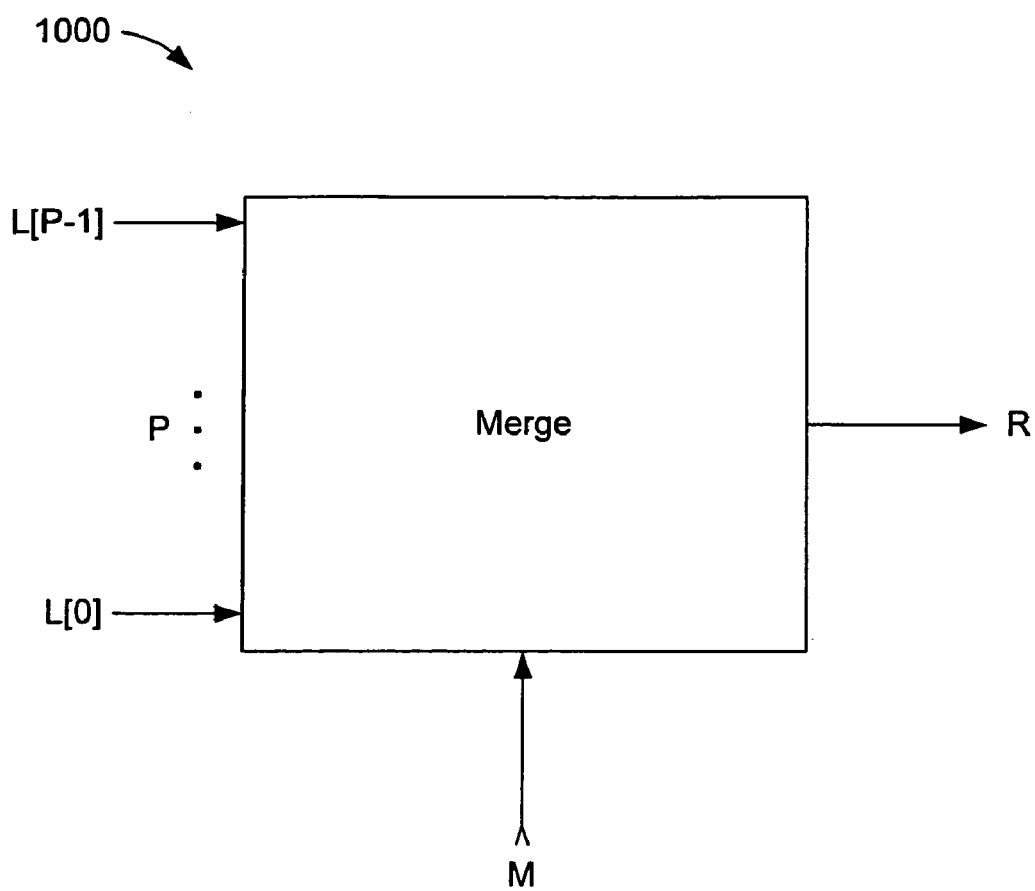

As described herein, Split 804 is a 1 to Q bus (e.g., Q=4) which reads a control channel S from control circuitry 808, reads one token of input data from write channel L, then sends the data to one of the Q output channels selected by the value read from S. Merge 806 is a P to 1 bus (e.g., P=4) which reads a control channel M from control circuitry 808, then reads a token of data from one of the P input channels as selected by the value read from M, then sends that data to a single output channel R. FIG. 9 shows a basic block diagram of a Split 900. FIG. 10 shows a basic block diagram of a Merge 1000. See also "Pipelined Asynchronous Circuits" by A. Lines incorporated by reference above.

According to a particular implementation, Split 804 includes one split_env part and Q split_cell parts, and Merge 806 includes one merge_env part and P merge_cell parts. The split_cell contains the part of Split 804 replicated for each output channel, and the split_env contains the rest of the circuitry. Likewise, the merge_cell contains the part of Merge 806 replicated for each input channel.

Figure 11:
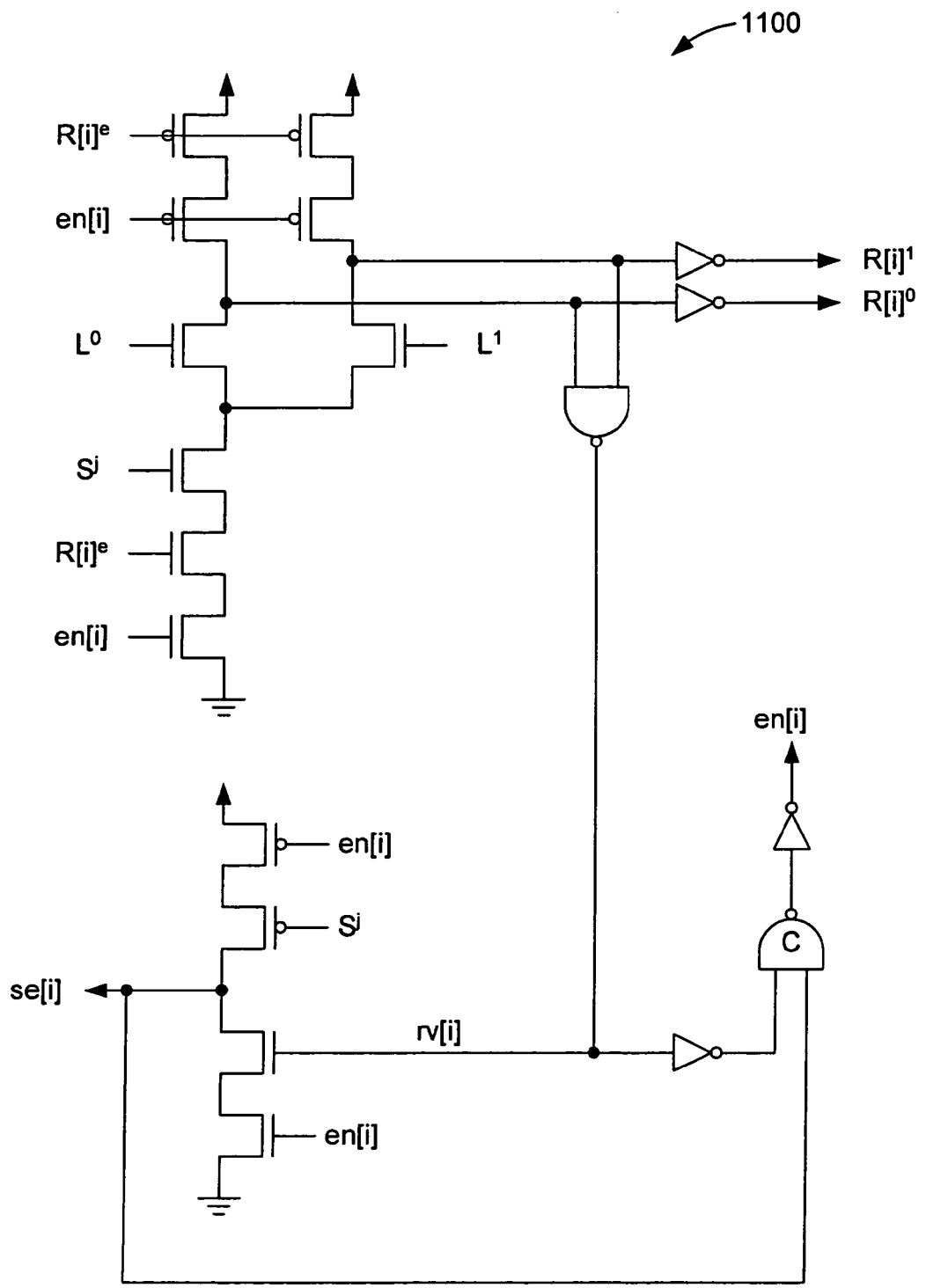

Functionally, each split_cell[i] waits for S to be valid and checks that the value of S equals i (that is, rail $S^i$ is true). If so, it checks the enable from its output $R[i]^e$ and when that is high, it copies the valid data from L to R[i]. Once the data are copied to R[i], the split_cell[i] lowers its enable to the split_env, se[i]. Eventually, the S, L, and R $[i]^e$ return to neutral, so that the split_cell[i] can reset the data and raise se[i] again. A schematic for a split_cell 1100 with 1-bit data and 1-bit control (both encoded as 1of2 codes) is shown in FIG. 11.

Figure 12:
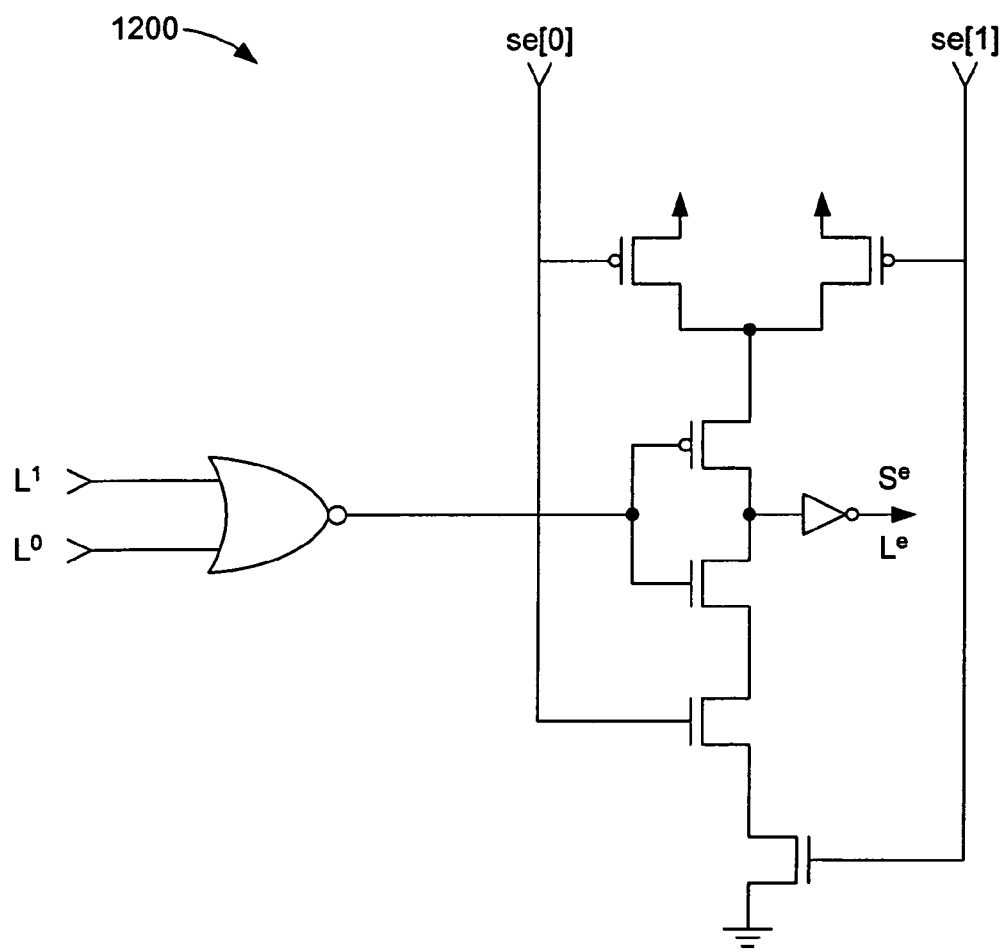

The split_env tests the validity and neutrality of the L channel, computes the logical AND of the se[0 . . . Q−1]'s from the split_cell's, and produces an acknowledge for the S and L input channels. The validity and neutrality of the S channel is implied by the acknowledges from the split_cell's. A schematic for a split_env 1200 for 1-bit data and 2 split_cell's is shown in FIG. 12.

Figure 13:
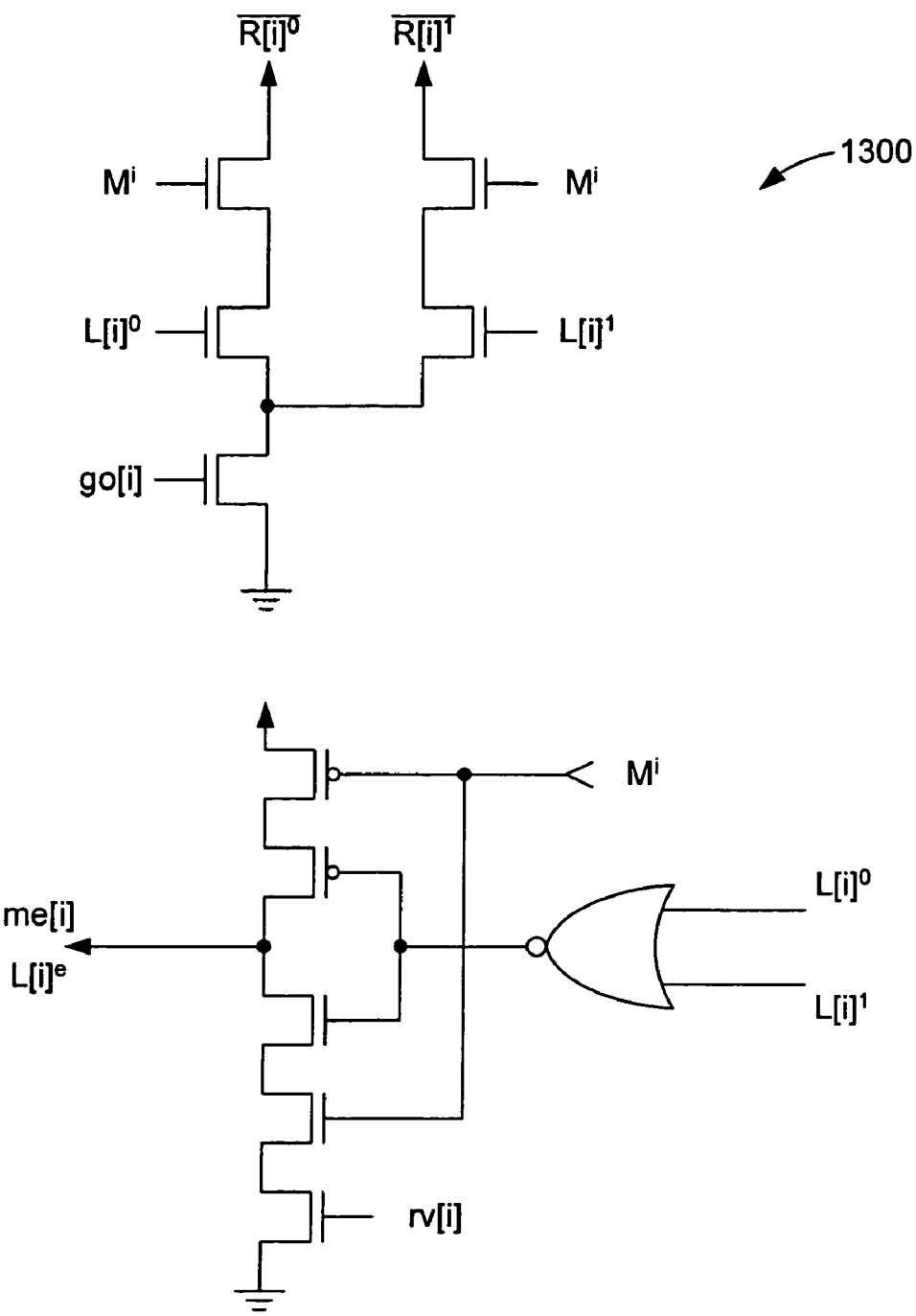

A schematic for a merge_cell 1300 with 1-bit data and 1-bit control (encoded as 1of2 codes) is shown in FIG. 13. Each merge_cell[i] waits for M to be valid and checks that the value of M equals i (that is, rail $M^i$ is true). If so, it waits for a go signal from the merge_env (which includes the readiness of the output enable $R^e$) and for the input data L[i] to be valid. When this happens, it copies the value of L[i] to R. The merge_env checks the validity of R and broadcasts this condition back to all the merge_cells's by setting rv high. Next, the merge_cell lowers its enables me[i] and $L[i]^e$. Once the M and L[i] data return to neutral, and go is lowered, the R is returned to neutral, rv is lowered, and the merge_cell raises the enables me[i] and $L[i]^e$.

Figure 14:
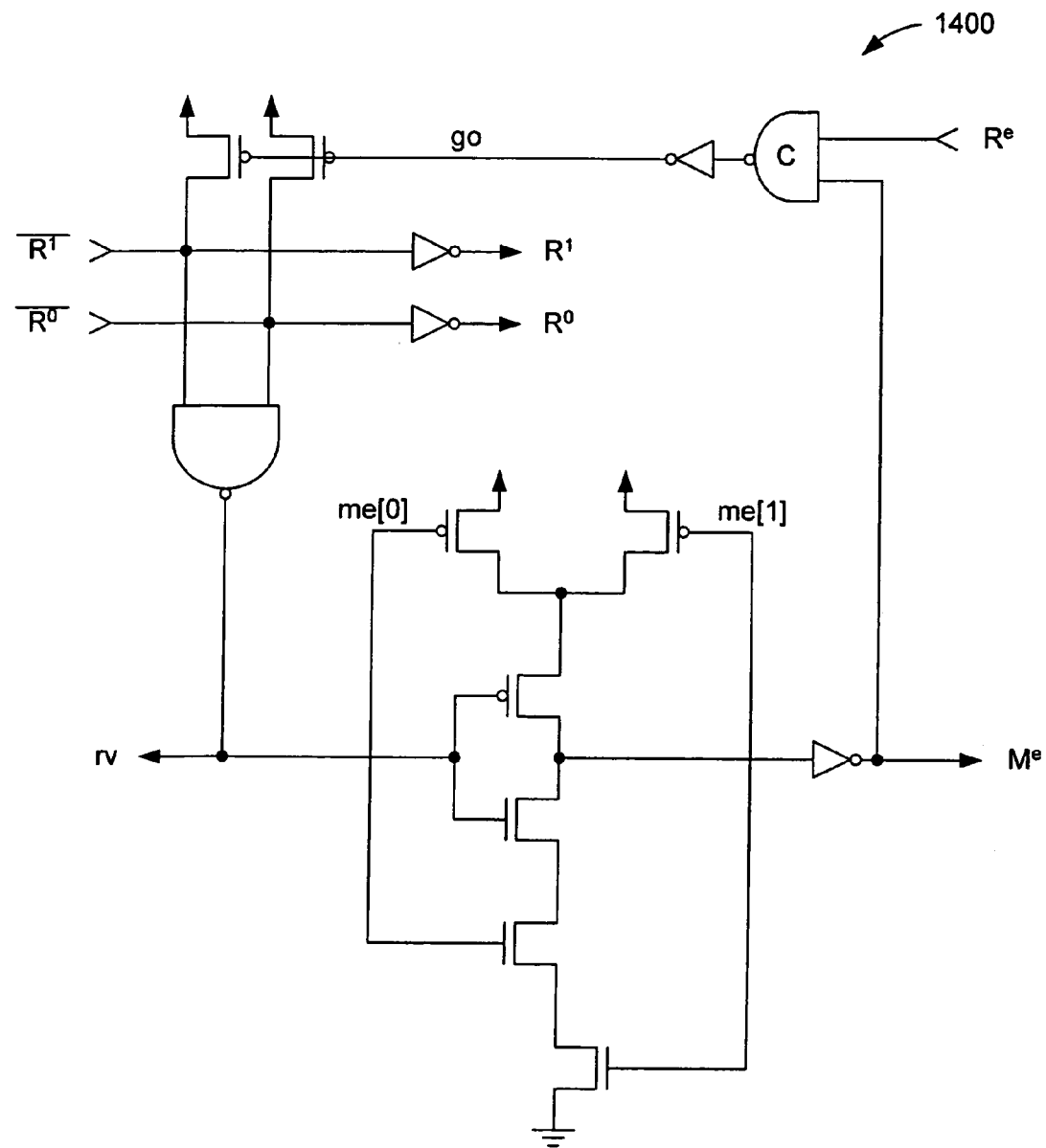

A schematic for a merge_env 1400 for 1-bit data and 2 merge cells is shown in FIG. 14. The merge_env checks the readiness of the R enable and raises go. The M goes directly to the merge_cell's, one of which responds by setting R to a new valid value. The merge_env then raises rv, after which the merge_cell replies with me[i]. The merge_env checks the completion of these actions, and then acknowledges M. Once M has become neutral again and R has acknowledged, the merge_env lowers go, which causes the merge_cell's to reset me[i]. The merge_env also resets R to the neutral value. Once these actions have been completed, the merge_env lowers the acknowledge of M.

Because the reading of SRAM state elements is relatively slow, read operations may be effected with only a partial signal swing on the bit lines, and sensing the bit line swings using sense amplifiers. Specific embodiments of the invention are contemplated which employ such an approach. However, it has become increasingly difficult to get consistent, reliable operation of sense amplifiers as the dimensions of semiconductor processes continue to shrink. In fact, a great deal of economic and engineering resources have been expended on this issue with mixed results. It may be merely that time is required to achieve reliable operation of analog circuits for each new process. On the other hand, real physical limitations may ultimately determine whether sense amplifiers may be successfully fabricated with newer generation processes.

In any case, according to a specific embodiment, a banked SRAM designed in accordance with the present invention does not employ sense amplifiers, instead allowing the bit lines their full swing. This slows down the operation of a particular bank, but with the appropriate number of SRAM banks and flow control, the effective data rate can be significantly higher than any one bank operating alone. According to a specific embodiment, to facilitate this, Merge 806 is implemented as a full buffer merge circuit which can store one data token on its input and one on its output. This full buffering takes advantage of the high-speed performance of the asynchronous channels to enable full speed on non-consecutive read operations to different banks.

Figure 8:
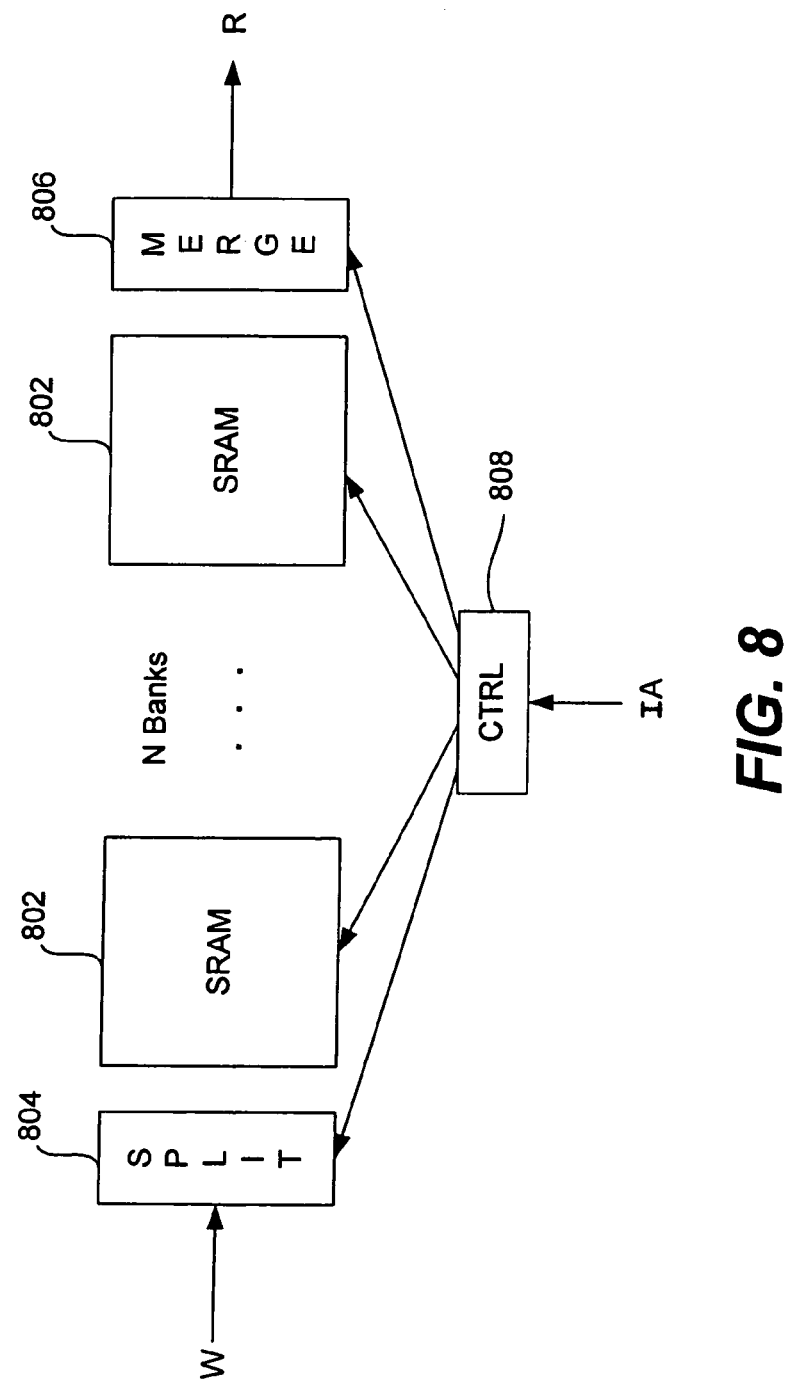
FIG. 8 is a block diagram of a particular implementation of a banked SRAM designed according to the present invention.
Figure 15:
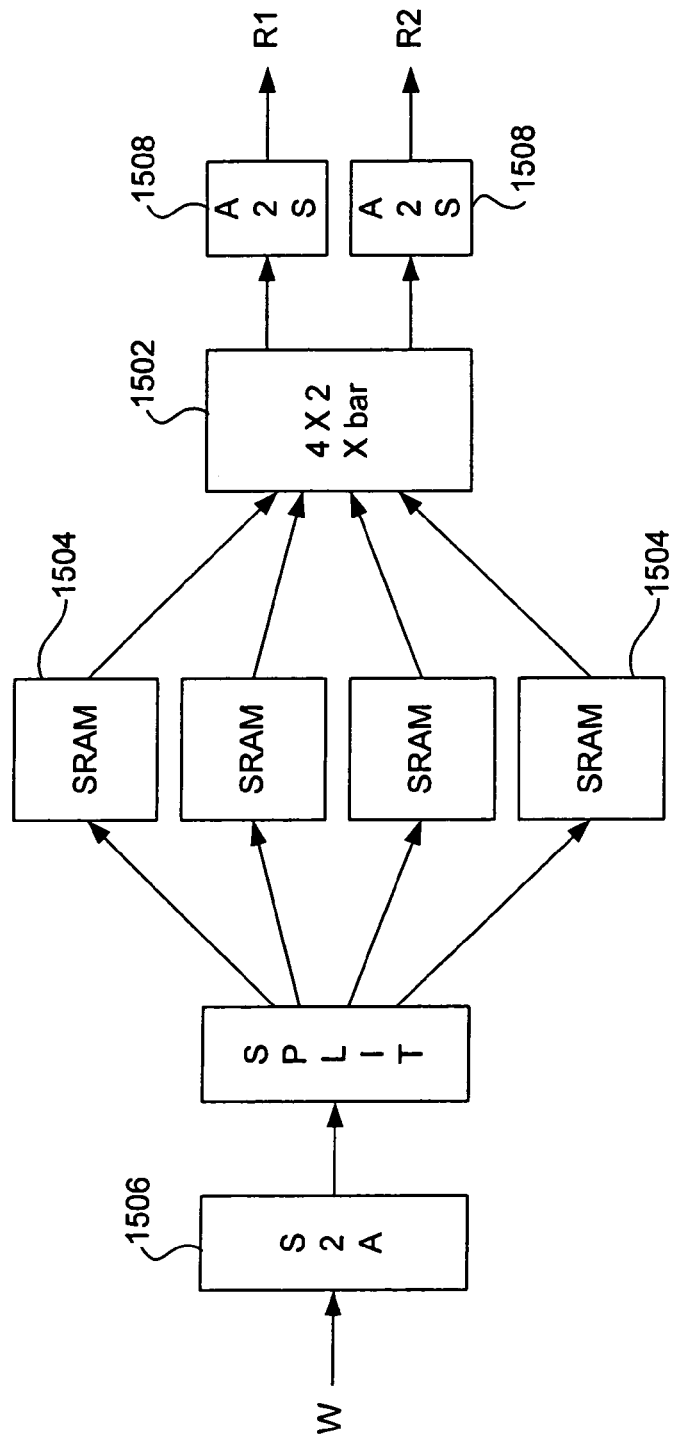
FIG. 15 is a block diagram of a multi-ported banked SRAM designed according to the present invention which includes circuits to convert to synchronous domains.

According to an alternative banked asynchronous SRAM design illustrated in FIG. 15, multiple read channels RI and R2 may be supported by replacing Merge 806 of FIG. 8 with a crossbar 1502 which, in this instance connects the four SRAM blocks 1504 to the read channels. According to various embodiments, any of a wide variety of crossbar designs may be employed. For example, combinations of the Split and Merge circuits described above with reference to FIGS. 9–14 may be employed to construct such a crossbar. In addition any of the crossbar circuits described in copending U.S. patent application Ser. No. 10/136,025 entitled ASYNCHRONOUS CROSSBAR WITH DETERMINISTIC OR ARBITRATED CONTROL filed on Apr. 30, 2002 (the entire disclosure of which is incorporated herein by reference for all purposes), may be employed to implement crossbar 1502. According to one embodiment, a crossbar is employed which is operable to route data from any of a plurality of input channels to any of a plurality of output channels according to routing control information. Each combination of an input channel and an output channel comprises one of a plurality of links. The crossbar is operable to route the data in a deterministic manner on each of the links thereby preserving a partial ordering represented by the routing control information. Events on different links are uncorrelated.

In fact, both Split 804 and Merge 806 may be replaced by a crossbar to increase the ported-ness of the SRAM without making any changes to the basic SRAM state element. In addition the number of ports on either side (i.e., read or write) are not limited to two. However, the practical number will relate to the number of SRAM banks, i.e., if there are only four banks, more than 4 read ports would never be fully utilized.

In addition and as shown in FIG. 15, such an SRAM design (and indeed any asynchronous SRAM design within the scope of the invention) may be employed in an otherwise synchronous system using synchronous-to-asynchronous (S2A) conversion circuitry 1506 and asynchronous-to-synchronous (A2S) conversion circuitry 1508 on the write and read ports, respectively. According to a specific embodiment, suitable conversion circuitry is described in copending U.S. patent application Ser. No. 10/212,574 entitled TECHNIQUES FOR FACILITATING CONVERSION BETWEEN ASYNCHRONOUS AND SYNCHRONOUS DOMAINS filed on Aug. 1, 2002, the entire disclosure of which is incorporated herein by reference for all purposes.

In SRAM designs with multiple banks (either single or multi-ported) where the bank speed is slower than the port speed, the asynchronous SRAM approaches the performance of the port speed on the average, but not for every access pattern. And if the lower performance access patterns are not calculated in advance, then this is essentially non-deterministic from a system perspective. If the asynchronous memory is used in a synchronous system (as discussed above with reference to FIG. 15), and that synchronous system needs "deterministic" performance, then the system may count on the overall SRAM performance equivalent to the bank speed, or in a different possible embodiment, logic could be added to signal a "wait state" to the synchronous system, based on detecting a bank conflict in the asynchronous SRAM, so that the synchronous system can build a condition into its state-machine that encodes "no SRAM access this cycle" and may thus behave "deterministically" and still attain the performance of the asynchronous SRAM ports on the average.

It should be noted that the banked SRAM designs of FIGS. 8 and 15 are applicable to SRAM designs based on the single-ported 6T SRAM state element, as well as those employing dual-ported 10T SRAM state elements, specific implementations of which are described below.

Figure 16:
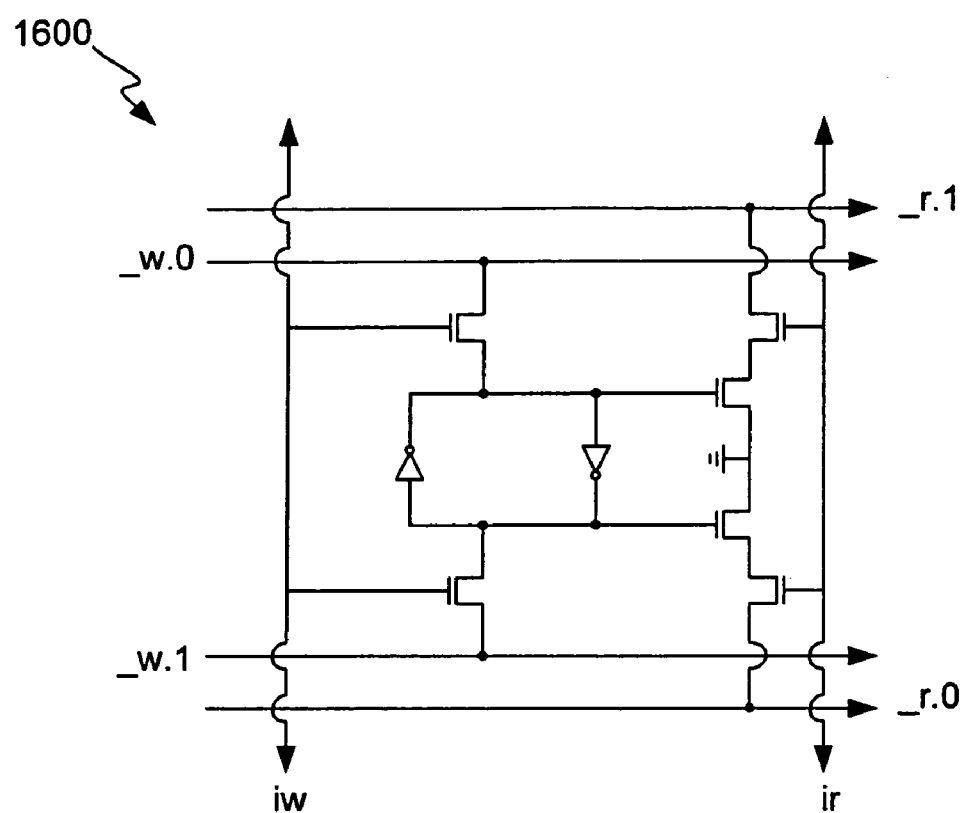
FIG. 16 is a schematic diagram of a dual-ported 10T SRAM state element for use with various embodiments of the present invention.

According to further embodiments of the present invention, SRAM blocks are provided which employ conventional ten transistor (10T) dual-ported SRAM state elements. An example of such a 10T state element 1600 is shown in FIG. 16 in which two buses are employed, one for writing and one for reading. That is, write bus lines _w.0 and _w.1 are used in conjunction with address line iw for writing to state element 1600, while read bus lines _r.0 and _r.1 are used in conjunction with address line ir for reading from state element 1600. As compared to the 6T state element of FIG. 1, the 10T state element requires more die area, but is considerably faster. In addition, because of the separate read and write buses, substantially simultaneous read and write operations to different addresses in the same SRAM bank may occur with 10T state elements. A dual-ported, 10T embodiment might be useful, for example, in applications where the need for speed overwhelms area concerns, or where the size of the memory (in terms of how much information is intended to be stored) is relatively small (e.g., a register file). In the latter type of embodiment, it will be understood that, where the memory is small enough, the need to divide the SRAM into sets may be greatly diminished or eliminated. Thus, both embodiments with sets and embodiments without sets are contemplated.

A specific implementation of an asynchronous SRAM employing 10T state elements (e.g., state element 1600 of FIG. 16) will now be described with reference to FIGS. 17–21. It will be understood by those of skill in the art that because the hierarchical framework and many of the implementation details discussed above with reference to those embodiments is sufficiently similar to the dual-ported embodiments, such details are not discussed again here for the sake of brevity. That is, only the significant differences between the two types of embodiments are discussed. It should also be noted that, according to a specific implementation, 10T embodiments may be more robust to delay variations than previously described embodiments in that such embodiments may be implemented using only a single timing assumption, i.e., that the 10T state elements have latched in response to the write signals.

As shown in FIG. 17, the enable signal "en" is employed to pre-charge the read bus (i.e., _r.0 and _r.1). Read port cell 1702, which comprises a one-transition output half-buffer boosts read signals _r.0 and _r.1 to read signals R.0 and R.1, respectively, while also providing a read completion signal _ r.v. Thus, as with the single-ported 6T embodiments (e.g., circuit 406 of FIG. 4), a read operation on the conventional 10T SRAM state element is able to produce an output which is in the proper event-driven dual-rail channel format of the asynchronous system. However, read port cell 1702 has two fewer transitions than its counterpart in the single-ported design.

Write port cell 1704 is also relatively straightforward, simply inverting signals w.0 and w.1 and driving the write buses with the output, while also generating write completion signal _w.v. Depending on the number of information bits, completion of all the corresponding signals _w.v (for write operations), or all the corresponding signals _r.v (for read operations) may be accomplished in the same manner as for the 6T embodiments using Mueller C-element trees having $\log_2(N)$ stages where N is the number of information bits. Similarly, address completion may be accomplished in a similar manner, i.e., with an OR tree, as described above.

Figure 18:
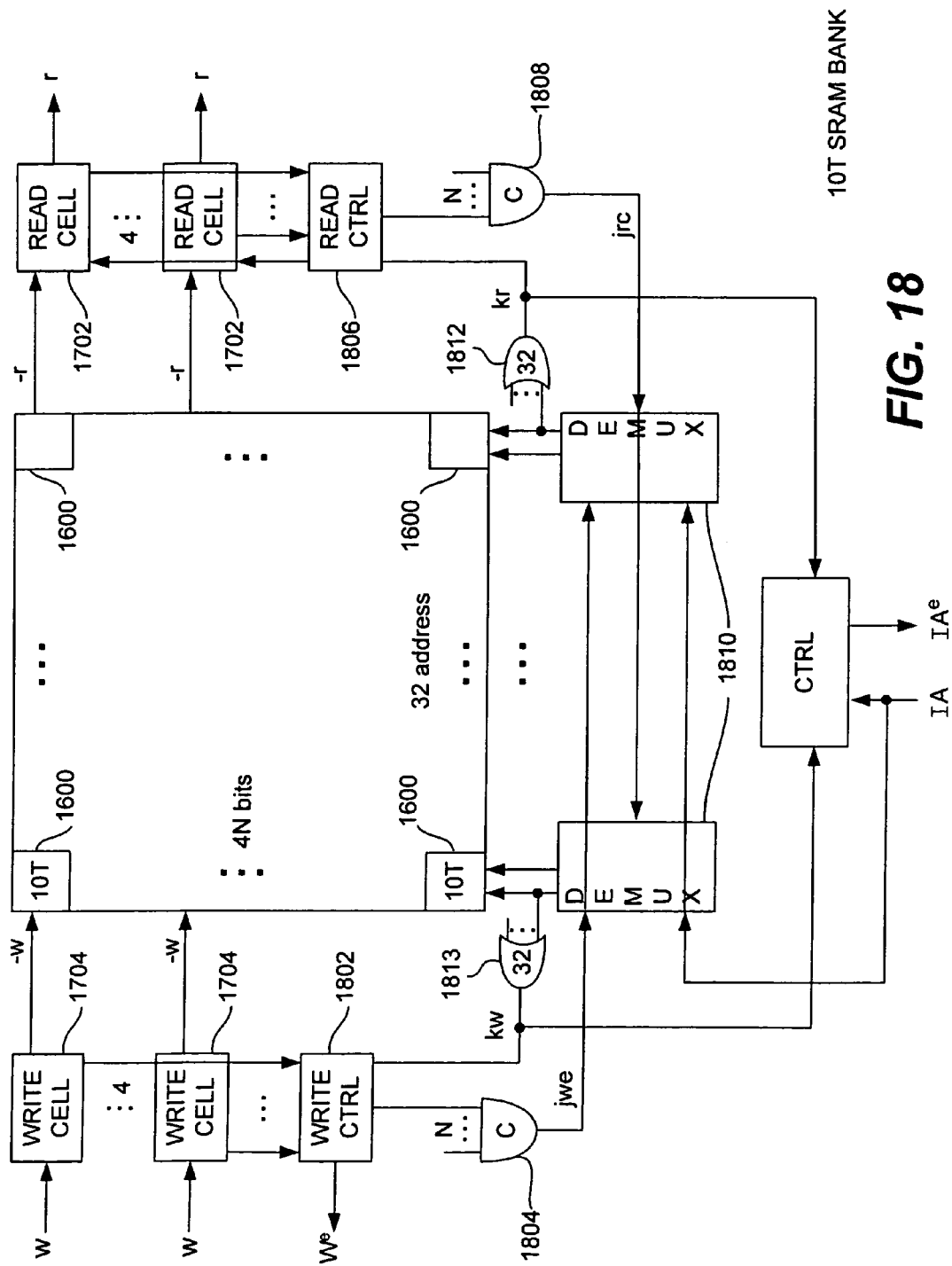

A dual-ported 10T embodiment based on the 10T SRAM state element shown in FIG. 16, and including the read and write port cells of FIG. 17 is shown in FIG. 18. It should be noted that, although the array is shown as a 32×4N array of SRAM state bits, this is merely a particular design which restricts the number of bits to a multiple of 4 and the number of bit lines to 32 for exemplary purposes only. It will be understood that any number of bit lines and bits may be supported.

Write Ctrl 1802 combines the 4 per bit write completion signal instances of _w.v from write port cells 1704. Write Ctrl 1802 handshakes with the address control through the signal kw, and produces jwe. Write Ctrl 1802 also acknowledges the 4 bit write data W to the larger SRAM, utilizing the write completion timing assumption. A specific implementation of a Write Ctrl 1802 is shown in FIG. 19. C-element 1804 collects the N write nibble completion signals jwe, and produces the write demux precharge signal jw.e.

Read Ctrl 1806 combines the 4 per bit read completion signal instances of _r.v from read port cells 1702. Read Ctrl 1806 handshakes with the address control through the signal kr, and produces jre. Read Ctrl 1806 also produces the precharge signal en that precharges the read lines of the SRAM. A specific implementation of Read Ctrl 1806 is shown in FIG. 19. C-element 1808 collects the N read nibble completion signals jre, and produces the write demux precharge signal jr.e.

Figure 20:
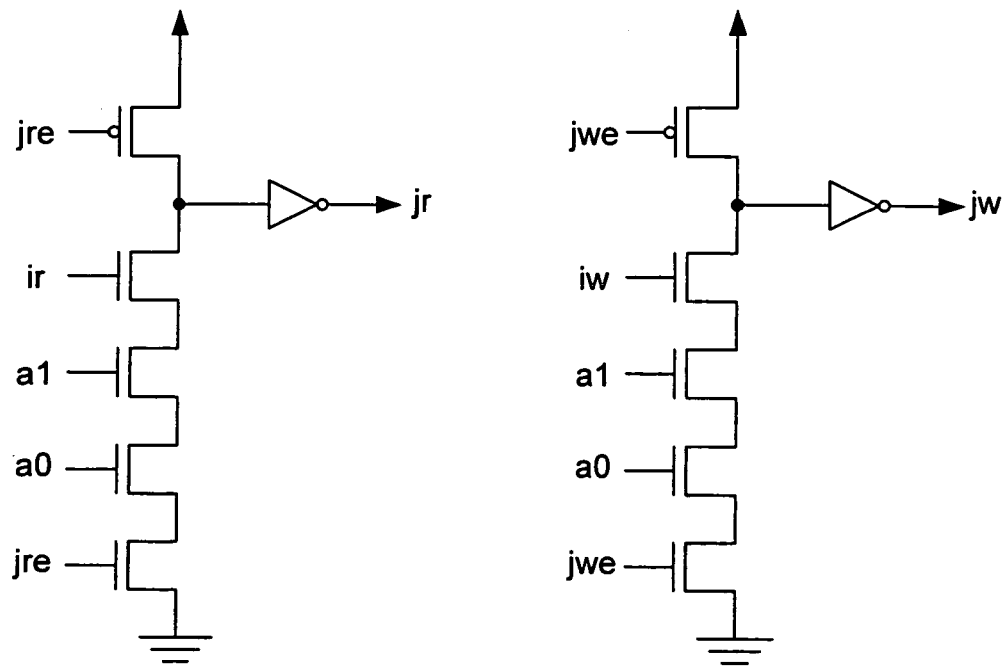

Demultiplexers 1810 de-multiplex the address and read/write instruction encoded in IA into individual read and write select lines for the 32 lines. As an optimization, the read decode may be precharged with jr.e and the write decode may be precharged with jw.e. A specific implementation of a Demultiplexer 1810 is shown in FIG. 20.

Figure 21:
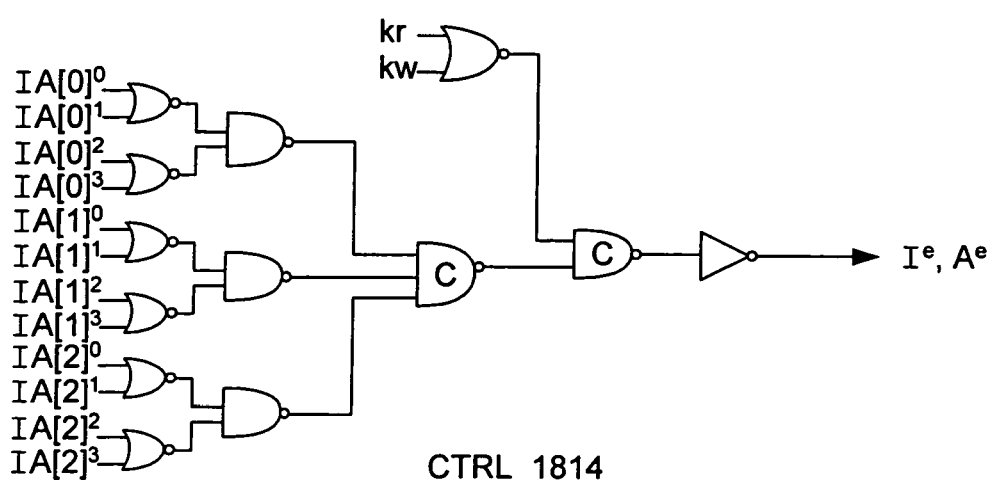

Or gate 1812 completes the 1 of 32 read select creating the signal kr, and Or gate 1813 completes the 1 of 32 write select, creating the signal kw. Ctrl 1814 completes IA, and combines IA completion with kr and kw, producing IA.e, the IA channel acknowledge. A specific implementation of Ctrl 1814 is shown in FIG. 21. According to an alternate embodiment, the demultiplexing of the addresses is not acknowledged, an additional timing assumption being made that this operation is accomplished sufficiently quickly to allow otherwise delay-insensitive operation.

As shown, SRAM block 1800 includes an array of 10T SRAM state elements 1600 combined with asynchronous four-phase channels. In the documents incorporated by reference herein, conditional and non-conditional asynchronous channels are defined. In summary, a non-conditional channel goes through a hand-shake on every cycle, while a conditional channel only cycles under certain control circumstances. According to a specific embodiment of the SRAM block, the instruction channel is non-conditional. It contains an address and a read/write (or read and write) instruction for every access to the memory. The write channel is conditional on the write instruction and places data from the W channel into the array. The read channel is conditional on the read instruction and gets data out of the array and places it on the R channel. The signals kr and kw are the mechanisms used to synchronize the W and R channels with Ctrl 1814.

The operation of SRAM block 1800 will now be described in further detail. An instruction enters the SRAM via channel IA and is decoded into a 1of32 read select (ir) line or a 1of32 write select line (iw) in Demultiplexer 1810. According to a specific embodiment, for efficiency this decoding is done in a precharged computation. The Demux Complete 1812 "completes" the 1of32 code (ir for a read, iw for a write). For a write, the data is buffered in write port cells 1704 and broadcast across the state bits (_w.x). Write Ctrl 1802 completes _w.v and combines the completion signal with kw generating it's completion jwe. Write Complete 1804 completes the N jwe signals and produces jw.e which, according to one embodiment, is the precharge for Demultiplexer 1810 for the write select. It should be noted that this precharging may be included for performance but is not necessary for a functioning implementation.

Similarly, on a read, the read select lines allow the state bit to pull down the read lines. Read port cells 1702 contain a "pipelined" buffer stage, buffering _r to R. Read port cells 1702 also contain the read line precharge transistors. Read Ctrl 1806 completes the read lines, combines that completion with kr and generates the read line precharge signal en, and its own completion signal jre. Read Complete 1808 completes the N jre signals and produces jr.e which, according to one embodiment, is used to precharge the decode for the read select line (ir) in Demultiplexer 1810. Again, it should be noted that this precharging may be included for performance but is not necessary for a functioning implementation. Finally Ctrl 1814 completes the address and the kr and kw signals to generate the acknowledge for the instruction, IA.e.

According to a specific embodiment, Ctrl 1814 may be implemented to allow simultaneous writes and reads to the SRAM array. That is, as long as it can be guaranteed that the addresses for the read and write instructions will not collide, simultaneous write and read instructions may be executed. Additional circuitry can be added outside the bank of SRAM to detect when the same address is being read and written, and instead of reading from the SRAM, bypass the write data directly to the read port.

According to various embodiments, additional read and write ports may be added by duplicating the appropriate portions of the circuitry described above and by including additional read or write buses.

According to various embodiments of the invention, each of the bit lines has an associated staticizer to keep the buses at their pre-charged levels when not in use. According to a specific one of these embodiments analog circuit techniques are applied to these staticizers which enable the bit lines to be pulled down more quickly.

While the invention has been particularly shown and described with reference to specific embodiments thereof, it will be understood by those skilled in the art that changes in the form and details of the disclosed embodiments may be made without departing from the spirit or scope of the invention. For example, the circuits and processes described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for using in conjunction with the processes described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A static random access memory (SRAM) comprising a plurality of SRAM state elements and SRAM environment circuitry, the SRAM environment circuitry being operable to interface with external asynchronous circuitry and to enable reading of and writing to the SRAM state elements in a delay-insensitive manner provided that at least one timing assumption relating to bit lines included in the SRAM environment circuitry is met, wherein the external asynchronous circuitry is characterized by an event-driven protocol, and wherein the event-driven protocol between a first sender and a first receiver in the external asynchronous circuitry comprises, (1) the first sender sets a data signal valid when an enable signal from the first receiver goes high, (2) the first receiver lowers the enable signal upon receiving the valid data signal, (3) the first sender sets the data signal neutral upon receiving the low enable signal, and (4) the first receiver raises the enable signal upon receiving the neutral data signal.

2. The SRAM of claim 1 wherein the at least one timing assumption comprises at least one of assuming sufficient pre-charging of the bit lines in response to an enable signal representing completion of a previous memory access operation, and assuming latching of the SRAM state elements in response to write signals on the bit lines.

3. The SRAM of claim 1 wherein the at least one timing assumption comprises a single timing assumption which assumes latching of the SRAM state element in response to write signals on the bit lines.

4. The SRAM of claim 1 wherein the SRAM state elements comprise conventional, six-transistor (6T) SRAM state elements.

5. The SRAM of claim 1 wherein the SRAM state elements comprise conventional, ten-transistor (10T) SRAM state elements.

6. The SRAM of claim 1 wherein the SRAM environment circuitry comprises read circuitry, write circuitry and address generation circuitry.

7. The SRAM of claim 6 wherein the address generation circuitry is operable to generate delay-insensitive addresses from an asynchronous address channel.

8. The SRAM of claim 7 wherein the address generation circuitry is operable to generate an address generation completion signal indicating complete decoding of an address value.

9. The SRAM of claim 8 wherein the address generation circuitry is operable to be precharged in response to at least one completion signal from the read circuitry and the write circuitry.

10. The SRAM of claim 6 wherein the SRAM environment circuitry is operable to enable reading of and writing to the SRAM state elements in the delay-insensitive manner provided that an additional timing assumption is met, the additional timing assumption being that the address generation circuitry has decoded an address value.

11. The SRAM of claim 6 wherein the read circuitry is operable to facilitate transmission of a data token from the SRAM state elements to the external asynchronous circuitry via a read channel in response to a read instruction and an enable signal representing completion of a previous memory access operation.

12. The SRAM of claim 11 wherein the read channel is an asynchronous channel characterized by the event-driven protocol, the read circuitry being operable to facilitate transmission of the data token to the read channel according to the event-driven protocol.

13. The SRAM of claim 12 wherein the read channel is further characterized by a one-hot data encoding scheme, the read circuitry being further operable to facilitate the transmission of the data token according to the one-hot encoding scheme.

14. The SRAM of claim 6 wherein the write circuitry is operable to facilitate transmission of a data token from the external asynchronous circuitry to the SRAM state elements via a write channel in response to a write instruction and an enable signal representing completion of a previous memory access operation.

15. The SRAM of claim 14 wherein the write channel is an asynchronous channel characterized by the event-driven protocol, the write circuitry being operate to facilitate transmission of the data token from the write channel according to the event-driven protocol.

16. The SRAM of claim 15 wherein the event-driven protocol is delay-insensitive.

17. The SRAM of claim 1 wherein the SRAM state elements are configured in a plurality of sets to reduce the capacitive loading on the SRAM state elements.

18. The SRAM of claim 1 wherein the SRAM state elements and the SRAM environment circuitry are organized into a plurality of SRAM banks, the external asynchronous circuitry comprising a write channel and a read channel, the SRAM further comprising split circuitry for enabling transmission of write data tokens from the write channel to any of the SRAM banks, and merge circuitry for enabling transmission of read data tokens from any of the SRAM banks to the read channel.

19. The SRAM of claim 18 wherein the external asynchronous circuitry comprises a plurality of write channels, the split circuitry comprising a crossbar circuit which is operable to route the write data tokens from any of the plurality of write channels to any of the SRAM banks according to routing control information.

20. The SRAM of claim 19 wherein each combination of a write channel and an SRAM bank comprises one of a plurality of links, the crossbar circuit being further operable to route the write data tokens in a deterministic manner on each of the links thereby preserving a partial ordering represented by the routing control information, wherein events on different links are uncorrelated.

21. The SRAM of claim 19 wherein the plurality of SRAM banks comprises four SRAM banks and the plurality of write channels comprises two write channels, the crossbar circuit comprising a 2×4 crossbar.

22. The SRAM of claim 18 wherein the external asynchronous circuitry comprises a plurality of read channels, the merge circuitry comprising a crossbar circuit which is operable to route the read data tokens from any of the SRAM banks to any of the plurality of read channels according to routing control information.

23. The SRAM of claim 22 wherein each combination of an SRAM bank and a read channel comprises one of a plurality of links, the crossbar circuit being further operable to route the read data tokens in a deterministic manner on each of the links thereby presenting a partial ordering represented by the routing control information, wherein events on different links are uncorrelated.

24. The SRAM of claim 22 wherein the plurality of SRAM banks comprises four SRAM banks and the plurality of read channels comprises two read channels, the crossbar circuit comprising a 4×2 crossbar.

25. An integrated circuit comprising the SRAM of claim 1.

26. The integrated circuit of claim 25 wherein the integrated circuit comprises any of a CMOS integrated circuit, a GaAs integrated circuit, and a SiGe integrated circuit.

27. The integrated circuit of claim 26 wherein the integrated circuit comprises at least one of a processor, an I/O controller, and a switch.

28. At least one computer-readable medium having data structures stored therein representative of the SRAM of claim 1.

29. The at least one computer-readable medium of claim 28 wherein the data structures comprise a simulatable representation of the SRAM.

30. The at least one computer-readable medium of claim 29 wherein the simulatable representation comprises a netlist.

31. The at least one computer-readable medium of claim 28 wherein the data structures comprise a code description of the SRAM.

32. The at least one computer-readable medium of claim 31 wherein the code description corresponds to a hardware description language.

33. A set of semiconductor processing masks representative of at least a portion of the SRAM claim 1.

34. The SRAM of claim 1 wherein the SRAM environment circuitry comprises a read channel operable to receive read data from the SRAM state elements, a write channel operable to transmit write data to the SRAM ate elements, and an instruction channel operable to receive instruction data comprising an address and at least one of a read instruction and a write instruction, and wherein the instruction channel is operable to receive the instruction data every cycle, the read channel is operable to receive the read data only when the instruction data comprises a read instruction, and the write channel is only operable to transmit the write data when the instruction data comprises a write instruction.

* * * * *